US008264250B2

(12) United States Patent
Kim et al.

(10) Patent No.: US 8,264,250 B2
(45) Date of Patent: Sep. 11, 2012

(54) ARRAY SUBSTRATE HAVING INCREASED INSPECTION EFFICIENCY AND DISPLAY APPARATUS HAVING THE SAME

(75) Inventors: Sung-Man Kim, Seoul (KR); Myung-Koo Hur, Anyang-si (KR); Beom-Jun Kim, Seoul (KR); Seong-Young Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 29 days.

(21) Appl. No.: 12/560,699

(22) Filed: Sep. 16, 2009

(65) Prior Publication Data

US 2010/0001756 A1 Jan. 7, 2010

Related U.S. Application Data

(63) Continuation of application No. 11/250,294, filed on Oct. 14, 2005, now Pat. No. 7,602,363.

(30) Foreign Application Priority Data

Oct. 25, 2004 (KR) ................................ 2004-85462
Dec. 20, 2004 (KR) ................................ 2004-108854

(51) Int. Cl.
*G01R 31/26* (2006.01)

(52) U.S. Cl. ................ 324/760.01; 324/762.01; 345/87

(58) Field of Classification Search ........................ None
See application file for complete search history.

(56) References Cited

U.S. PATENT DOCUMENTS

| | | | | |
|---|---|---|---|---|
| 5,774,100 | A * | 6/1998 | Aoki et al. | 345/87 |
| 6,091,203 | A * | 7/2000 | Kawashima et al. | 315/169.3 |
| 6,191,770 | B1 * | 2/2001 | Kim | 345/100 |
| 6,680,720 | B1 * | 1/2004 | Lee et al. | 345/90 |
| 7,385,576 | B2 * | 6/2008 | Moon | 345/87 |
| 2002/0140650 | A1 * | 10/2002 | Kai et al. | 345/87 |
| 2004/0222815 | A1 | 11/2004 | Kim et al. | |

FOREIGN PATENT DOCUMENTS

| | | |
|---|---|---|
| CN | 1412735 A | 4/2003 |
| KR | 10-0222311 B1 | 7/1999 |

* cited by examiner

*Primary Examiner* — Richard Isla Rodas
(74) *Attorney, Agent, or Firm* — Cantor Colburn LLP

(57) ABSTRACT

In an array substrate and a display apparatus, a pixel part has a plurality of gate lines, a plurality of data lines, and a plurality of pixels electrically connected to the gate and data lines. A driving circuit drives the pixel part electrically connected to a first end of the gate lines. An inspection circuit is electrically connected to a second end of the gate lines, and inspects the pixel part in response to an inspection signal externally provided. Thus, positions and causes for defects of the pixel part may be accurately detected, thereby improving inspecting efficiency.

13 Claims, 18 Drawing Sheets

100

200

400

ARRAY SUBSTRATE HAVING INCREASED INSPECTION EFFICIENCY AND DISPLAY APPARATUS HAVING THE SAME

CROSS REFERENCE TO RELATED APPLICATION

This application is a continuation of U.S. application Ser. No. 11/250,294, filed on Oct. 14, 2005, which claims priority to Korean Patent Application No. 2004-85462, filed on Oct. 25, 2004, and to Korean Patent Application No. 2004-108854, filed on Dec. 20, 2004 and all the benefits accruing therefrom under 35 U.S.C. §119, and the contents of which in their entireties are herein incorporated by reference.

BACKGROUND OF THE INVENTION

1. Field of the Invention

The present invention relates to an array substrate and a display apparatus having the array substrate. More particularly, the present invention relates to an array substrate having higher inspecting efficiency and a display apparatus having the array substrate.

2. Description of the Related Art

Recently, a liquid crystal display ("LCD") apparatus as one type of display apparatus includes an LCD panel displaying an image and a driving part driving the LCD panel.

The LCD panel includes a lower substrate, an upper substrate facing the lower substrate, and a liquid crystal layer disposed between the lower substrate and the upper substrate. The lower substrate includes a plurality of gate lines, a plurality of data lines, and a plurality of pixels formed therein.

The driving part includes a gate driving part and a data driving part. The gate driving part is electrically connected to the gate lines on the lower substrate of the LCD panel to sequentially output a gate signal to the gate lines. The data driving part is also electrically connected to the data lines on the lower substrate of the LCD panel to output a data signal to the data lines.

In the LCD apparatus, the gate driving part is formed at a side portion of the lower substrate while the pixels are formed by a thin film process. However, when the lower substrate, in which the gate driving part is formed, is inspected, it is difficult to detect positions and causes for defects.

BRIEF SUMMARY OF THE INVENTION

The present invention provides an array substrate having high inspecting efficiency.

The present invention also provides a display apparatus having the above array substrate.

In one exemplary embodiment of the present invention, an array substrate includes a substrate, a pixel part, a driving circuit, and an inspection circuit.

The pixel part has a plurality of gate lines, a plurality of data lines, and a plurality of pixels electrically connected to the gate lines and data lines. The driving circuit is electrically connected to a first end of the gate lines and drives the pixel part. The inspection circuit is electrically connected to a second end of the gate lines and inspects the pixel part in response to an inspection signal.

In another exemplary embodiment of the present invention, an array substrate includes a substrate, a pixel part, a driving circuit, a discharge circuit, and an inspection circuit.

The pixel part has a plurality of gate lines, a plurality of data lines, and a plurality of pixels electrically connected to the gate lines and data lines. The pixel part is formed on the substrate. The driving circuit is electrically connected to a first end of the gate lines and applies a driving signal to the pixel part. The driving circuit is also formed on the substrate.

The discharge circuit is electrically connected to a second end of the gate lines and discharges the driving signal applied to the pixel part. The discharge circuit is formed on the substrate. The inspection part is electrically connected to the second end of the gate lines and inspects the pixel part in response to an inspection signal. The inspection part is formed on the substrate.

In still another exemplary embodiment of the present invention, a display apparatus includes an array substrate and a facing substrate coupled to the array substrate. The array substrate includes a substrate, a pixel part, a driving circuit, and an inspection circuit.

The pixel part has a plurality of gate lines, a plurality of data lines, and a plurality of pixels electrically connected to the gate and data lines. The driving circuit is electrically connected to a first end of the gate lines and drives the pixel part. The inspection circuit is electrically connected to a second end of the gate lines and inspects the pixel part in response to an inspection signal.

In yet another exemplary embodiment of the present invention, an array substrate includes a plurality of data lines and an inspection circuit inspecting a first subset of the data lines during a first inspection, and inspecting a second subset of the data lines, distinct from the first subset of the data lines, during a second inspection.

According to the array substrate and the display apparatus, the inspection circuit inspects the gate lines divided into two groups during the first and second inspections, respectively. Thus, positions and causes for the defects of the pixel part may be accurately detected, thereby improving inspecting efficiency.

BRIEF DESCRIPTION OF THE DRAWINGS

The above and other features and advantages of the present invention will become more apparent by describing in detailed exemplary embodiments thereof with reference to the accompanying drawings, in which.

DETAILED DESCRIPTION OF THE INVENTION

Figure 1:
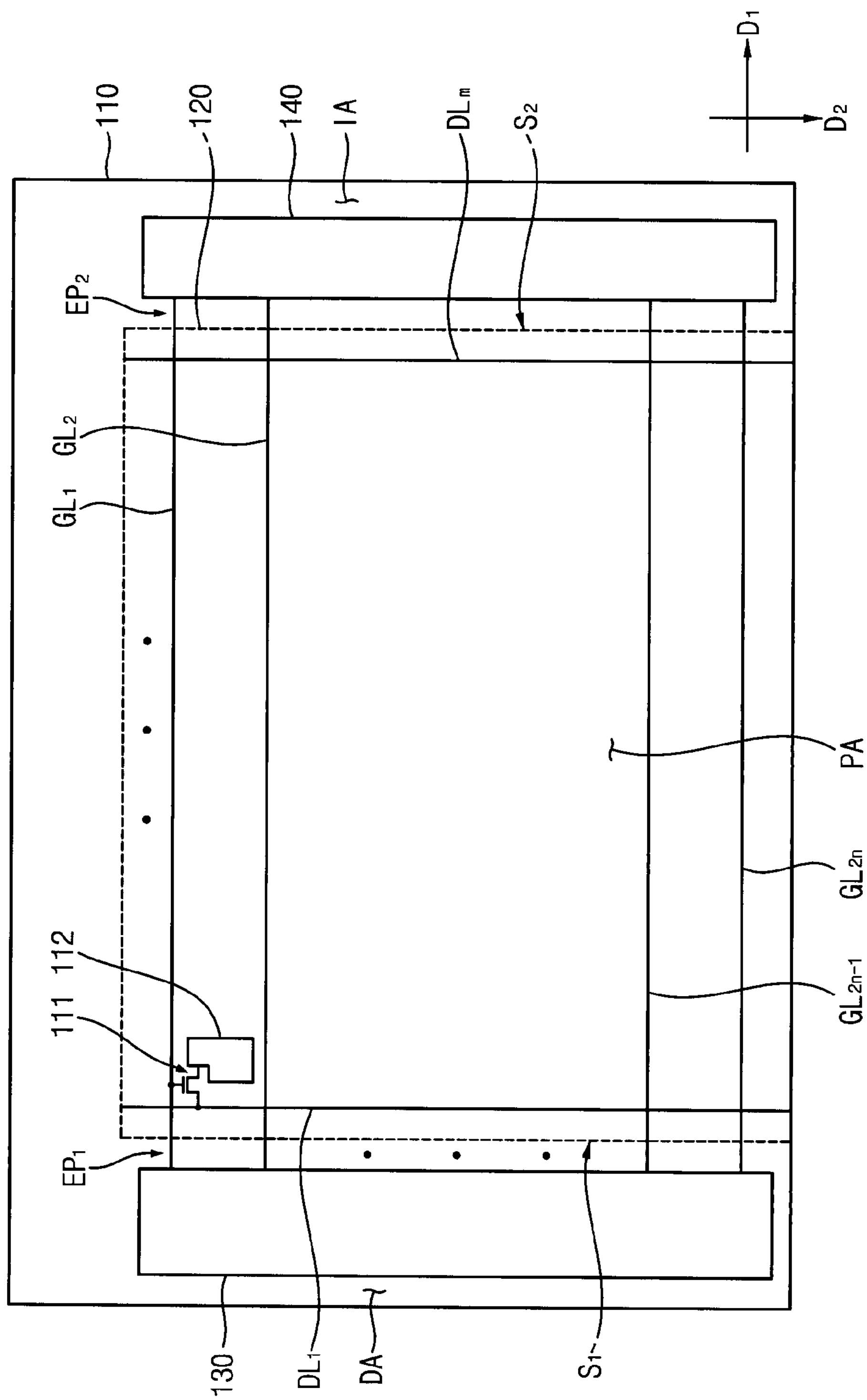
FIG. 1 is a plan view showing an exemplary embodiment of an array substrate according to the present invention.

Hereinafter, the embodiments of the present invention will be described in detail with reference to the accompanied drawings. In the drawings, the thickness and dimensions of layers, films, regions, and sections are exaggerated for clarity. Like numerals refer to like elements throughout.

FIG. 1 is a plan view showing an array substrate according to an exemplary embodiment of the present invention.

Referring to FIG. 1, an array substrate 100 includes a substrate 110, a pixel part 120, a gate driving circuit 130, and an inspection circuit 140.

The array substrate 100 may be a lower substrate of a liquid crystal display ("LCD") panel. The substrate 110 is divided into a pixel area PA in which the pixel part 120 is formed, a driving area DA in which the gate driving circuit 130 is formed, and an inspection area IA in which the inspection circuit 140 is formed. The driving area DA is adjacent to a first side S1 of the pixel area PA and the inspection area IA is adjacent to a second side S2 that is opposite to the first side S1 of the pixel area PA.

The pixel part 120 includes first to 2n-th gate lines GL1 to GL2*n*, first to m-th data lines DL1 to DLm, and a plurality of pixels, wherein n and m are natural numbers. The first to 2n-th gate lines GL1 to GL2*n* are extended in a first direction D1 and are substantially parallel to each other. The gate lines GL1 to GL2*n* extend generally from the driving area DA to the inspection area IA, crossing over the pixel area PA. The first to m-th data lines DL1 to DLm are extended in a second direction D2 substantially perpendicular to the first direction D1 and substantially parallel to each other. The data lines DL1 to DLm may also extend generally parallel to the first side S1 and the second side S2 of the pixel area PA. The first to 2n-th gate lines GL1 to GL2*n* are intersected with and insulated from the first to m-th data lines DL1 to DLm.

Each of the pixels includes a thin film transistor 111 ("TFT") and a pixel electrode 112. For example, the TFT 111 has a gate electrode connected to the first gate line GL1, a source electrode connected to the first data line DL1, and a drain electrode connected to the pixel electrode 112. While only one TFT 111 and one pixel electrode 112 are illustrated for clarity, it should be understood that there may be a plurality of TFTs 111 and pixel electrodes 112, where each pixel electrode 112 and TFT 111 may be formed within the intersection of a pair of adjacent gate lines and a pair of adjacent data lines.

The gate driving circuit 130 is electrically connected to a first end EP1 of the first to 2n-th gate lines GL1 to GL2*n*. The gate driving circuit 130 sequentially outputs a gate signal to the first to 2n-th gate lines GL1 to GL2*n* while the array substrate 100 is driven. Thus, the pixels connected to the first to 2n-th gate lines GL1 to GL2*n* are sequentially turned on in response to the gate signal from the gate driving circuit 130.

The inspection circuit 140 is electrically connected to a second end EP2 of the first to 2n-th gate lines GL1 to GL2*n*. The second end EP2 is opposite the first end EP1. As will be further described below, the inspection circuit 140 outputs a first driving voltage to odd-numbered gate lines GL1 to GL2*n*−1 during a first inspection time where the odd-numbered gate lines GL1 to GL2*n*−1 of the first to 2n-th gate lines GL1 to GL2*n* are inspected. Thus, odd-numbered pixels connected to the odd-numbered gate lines GL1 to GL2*n*−1 are turned on in response to the first driving voltage.

Also as will be further described below, the inspection circuit 140 outputs the first driving voltage to even-numbered gate lines GL1 to GL2*n* during a second inspection time where the even-numbered gate lines GL1 to GL2*n* of the first to 2n-th gate lines GL1 to GL2*n* are inspected. Thus, even-numbered pixels connected to the even-numbered gate lines GL1 to GL2*n* are turned on in response to the first driving voltage.

Figure 2:
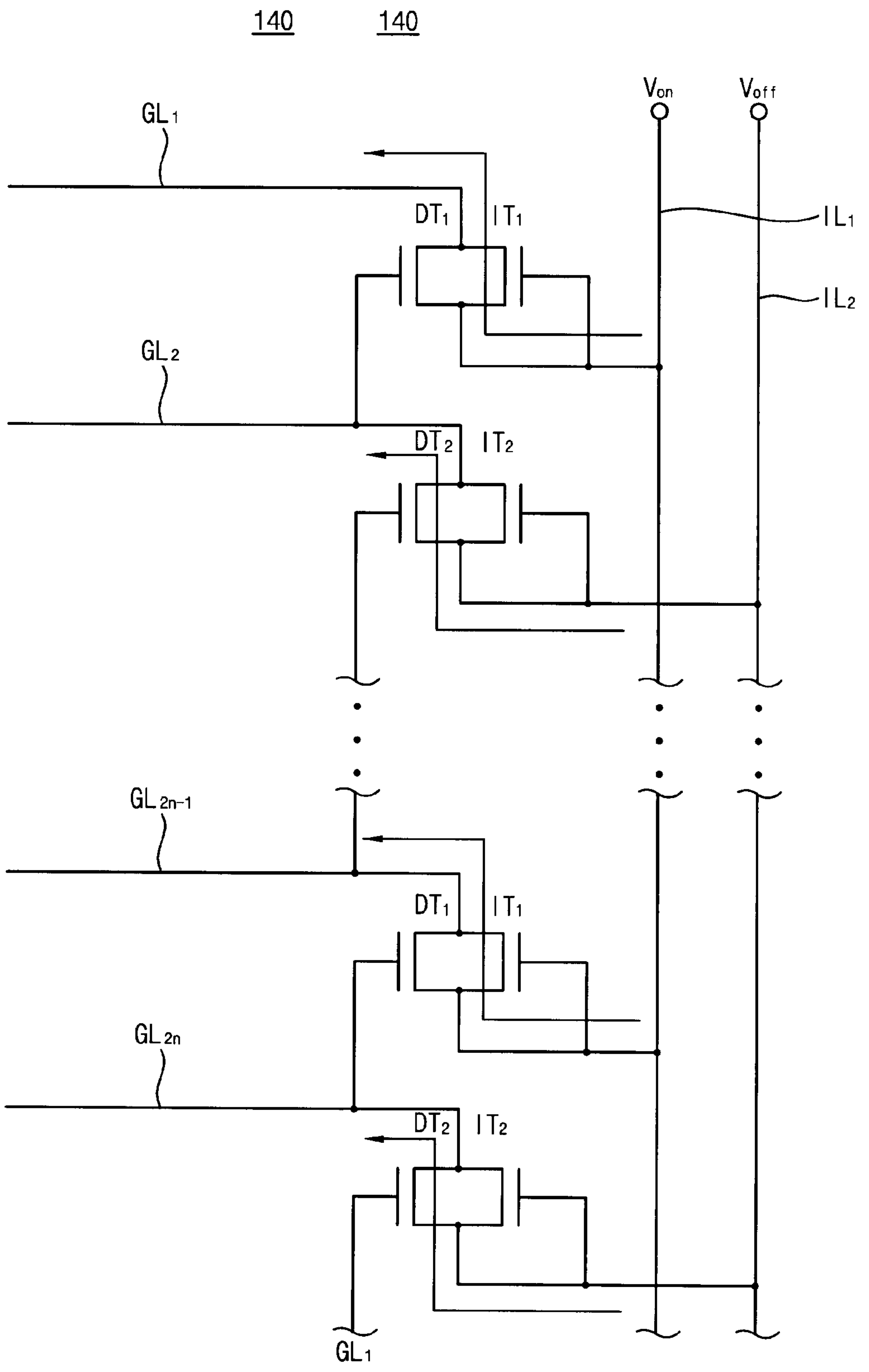
FIG. 2 is a circuit diagram illustrating an operation during a first inspection time of an exemplary inspection circuit shown in FIG. 1.
Figure 3:
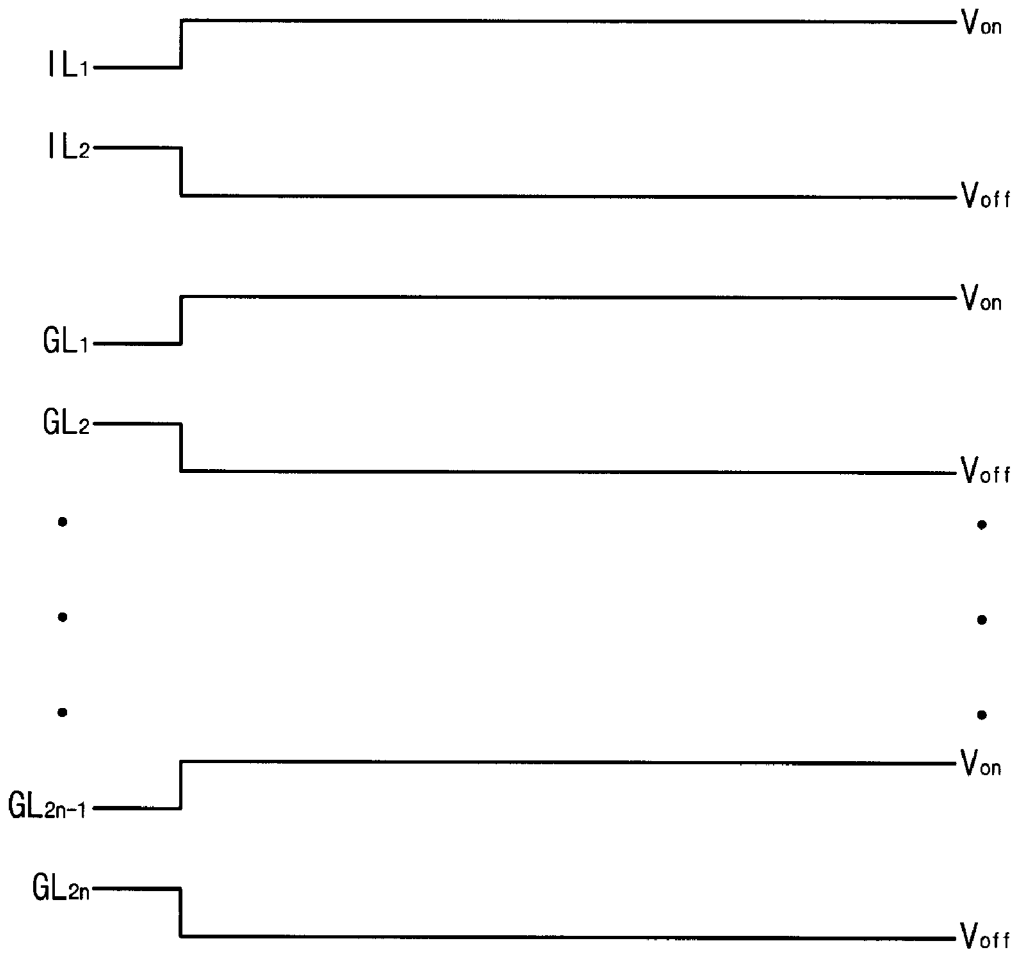
FIG. 3 is an input/output waveform diagram of the exemplary inspection circuit shown in FIG. 2.

FIG. 2 is a circuit diagram illustrating an operation during a first inspection time of an exemplary inspection circuit shown in FIG. 1. FIG. 3 is an input/output waveform diagram of the exemplary inspection circuit shown in FIG. 2.

Referring to FIGS. 2 and 3, the inspection circuit 140 includes first switching devices IT connected in parallel with second switching devices DT. In particular, the inspection circuit 140 includes a plurality of first odd-numbered switching devices IT1, a plurality of first even-numbered switching devices IT2, a plurality of second odd-numbered switching devices DT1, a plurality of second even-numbered switching devices DT2, a first inspection line IL1, and a second inspection line IL2. The first and second inspection lines IL1 and IL2 may run in the second direction D2, that is, they may extend generally perpendicularly to the gate lines GL1 to GL2*n*−1.

The first odd-numbered switching device IT1 has a first electrode connected to the odd-numbered gate lines GL1 to GL2*n*−1, and second and third electrodes connected to the first inspection line IL1. The first even-numbered switching device IT2 has a first electrode connected to the even-numbered gate lines GL2 to GL2*n*, and second and third electrodes connected to the second inspection line IL2.

The second odd-numbered switching device DT1 has a first electrode connected to the odd-numbered gate lines GL1 to GL2*n*−1, a second electrode connected to the next even-numbered gate lines, and a third electrode connected to the first inspection line IL1. The first electrode of the second odd-numbered switching device DT1 may be the same electrode as the first electrode of the first odd-numbered switching device IT1. Also, the third electrode of the second odd-numbered switching device DT1 may be the same electrode as the third electrode of the first odd-numbered switching device IT1. The second even-numbered switching device DT2 has a first electrode connected to the even-numbered gate lines GL2 to GL2*n*, a second electrode connected to the next odd-numbered gate lines, and a third electrode connected to the second inspection line IL2. The first electrode of the second even-numbered switching device DT2 may be the same electrode as the first electrode of the first even-numbered switching device IT1. Also, the third electrode of the second even-numbered switching device DT2 may be the same electrode as the third electrode of the first even-numbered switching device IT2.

The first inspection line IL1 receives the first driving voltage Von during the first inspection time where the odd-numbered gate lines GL1 to GL2*n*−1 are inspected, and receives the second driving voltage Voff during the second inspection time where the even-numbered gate lines GL2 to GL2*n* are inspected. Thus, FIG. 2 illustrates a first inspection time. The second inspection line IL2 receives the second driving voltage Voff during the first inspection time where the odd-numbered gate lines GL1 to GL2n−1 are inspected, and receives the first driving voltage Von during the second inspection time where the even-numbered gate lines GL2 to GL2n are inspected.

During the first inspection time, the first odd-numbered switching device IT1 applies the first driving voltage Von to the odd-numbered gate lines GL1 to GL2n−1 via the first electrode of the first odd-numbered switching device IT1, where the first driving voltage Von is inputted to the first odd-numbered switching device IT1 through the first inspection line IL1 via the second and third electrodes of the first odd-numbered switching device IT1. The second even-numbered switching device DT2 applies the second driving voltage Voff to the even-numbered gate lines GL2 to GL2n via the first electrode of the second even-numbered switching device DT2, where the second driving voltage Voff is inputted to the second even-numbered switching device DT2 through the second inspection line IL2 via the third electrode of the second even-numbered switching device DT2. Thus, the odd-numbered pixels connected to the odd-numbered gate lines GL1 to GL2n−1 are turned on, but the even-numbered pixels connected to the even-numbered gate lines GL2 to GL2n are turned off during the first inspection.

Also during the first inspection, the second odd-numbered switching device DT1 is turned off via the second electrode of the second odd-numbered switching device DT1 in response to the second driving voltage Voff applied to the even-numbered gate lines GL2 to GL2n, and the first even-numbered switching device IT2 is turned off via the second and third electrodes of the first even-numbered switching device IT2 in response to the second driving voltage Voff applied to the second inspection line IL2.

Thus, since the odd-numbered pixels connected to the odd-numbered gate lines GL1 to GL2n−1 are driven during the first inspection, the odd-numbered pixels and the odd-numbered gate lines GL1 To GL2n−1 may be targets for inspection during the first inspection time, as demonstrated in FIG. 3.

Figure 4:
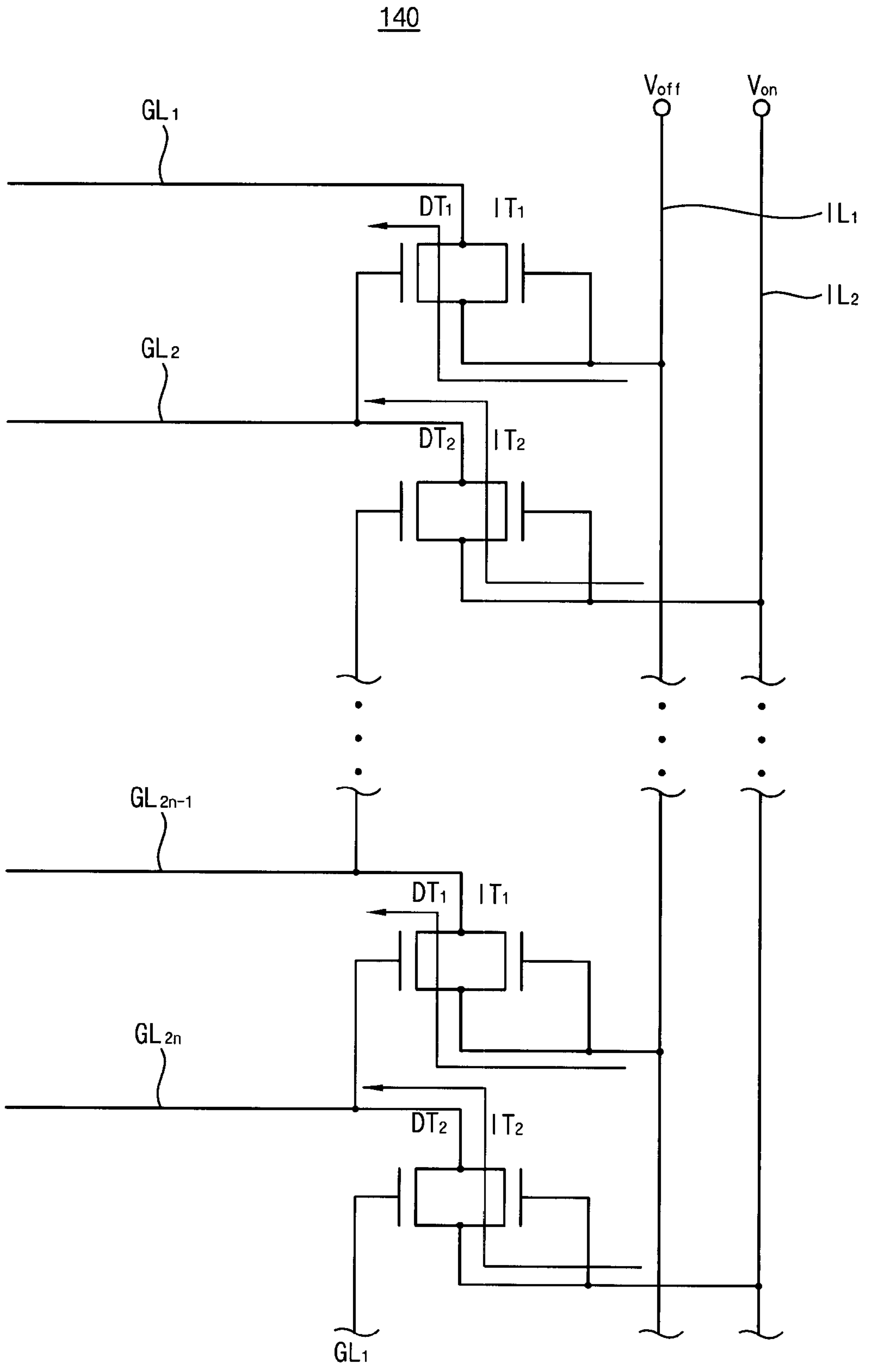
FIG. 4 is a circuit diagram illustrating an operation during a second inspection time of an exemplary inspection circuit shown in FIG. 1.
Figure 5:
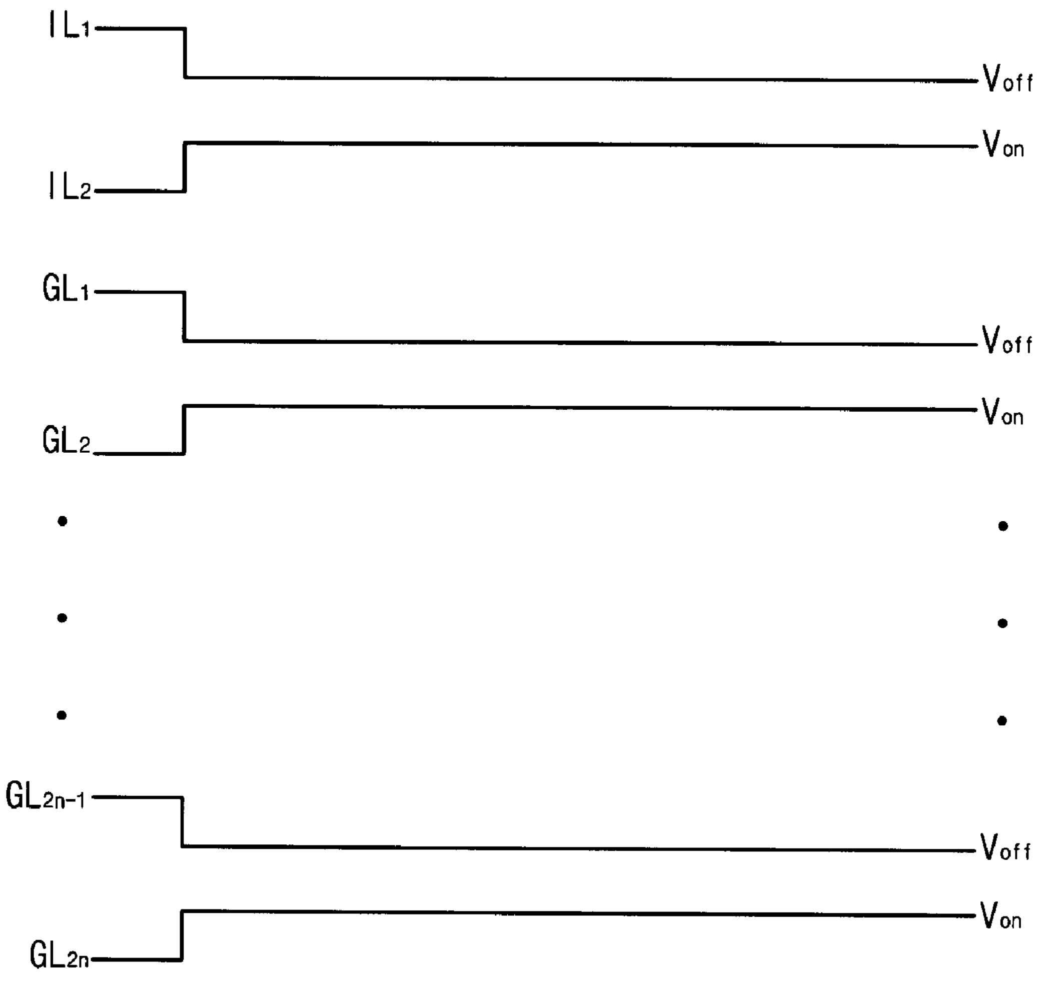
FIG. 5 is an input/output waveform diagram of the exemplary inspection circuit shown in FIG. 4.

FIG. 4 is a circuit diagram illustrating an operation during a second inspection of an exemplary inspection circuit shown in FIG. 1. FIG. 5 is an input/output waveform diagram of the exemplary inspection circuit shown in FIG. 4.

Referring to FIGS. 4 and 5, during the second inspection time, the first inspection line IL1 receives the second driving voltage Voff and the second inspection line IL2 receives the first driving voltage Von. As further illustrated, during the second inspection where the even-numbered gate lines GL2 to GL2n are inspected, the first even-numbered switching device IT2 applies the first driving voltage Von to the even-numbered gate lines GL2 to GL2n via the first electrode of the first even-numbered switching device IT2, which is inputted to the first even-numbered switching device IT2 through the second inspection line IL2 and through the second and third electrodes of the first even-numbered switching device IT2. The second odd-numbered switching device DT1 applies the second driving voltage Voff to the odd-numbered gate lines GL1 to GL2n−1 via the first electrode of the second odd-numbered switching device DT1, which is inputted to the second odd-numbered switching device DT1 through the first inspection line IL1 and through the third electrode of the second odd-numbered switching device DT1. Thus, the even-numbered pixels connected to the even-numbered gate lines GL2 to GL2n are turned on, but the odd-numbered pixels connected to the odd-numbered gate lines GL1 to GL2n−1 are turned off during the second inspection.

Also during the second inspection, the second even-numbered switching device DT2 is turned off via the second electrode of the second even-numbered switching device DT2, in response to the second driving voltage Voff applied to the odd-numbered gate lines GL1 To GL2n−1, and the first odd-numbered switching device IT1 is turned off via the second and third electrodes of the first odd-numbered switching device IT1, in response to the second driving voltage Voff applied to the first inspection line IL1.

That is, the even-numbered pixels and the even-numbered gate lines GL2 to GL2n may be targets for inspection during the second inspection time since the even-numbered pixels connected to the even-numbered gate lines GL2 to GL2n are driven during the second inspection, as demonstrated in FIG. 5.

The inspection circuit 140 inspects the first to 2n-th gate lines GL1 to GL2n divided into two groups during the first and second inspections, respectively, so that positions and causes for the defects of the pixel part 120 may be accurately detected. As a result, the inspection circuit 140 may have high inspecting efficiency. In the illustrated example, the two groups include an even-numbered set of gate lines and an odd-numbered set of gate lines.

Figure 6:
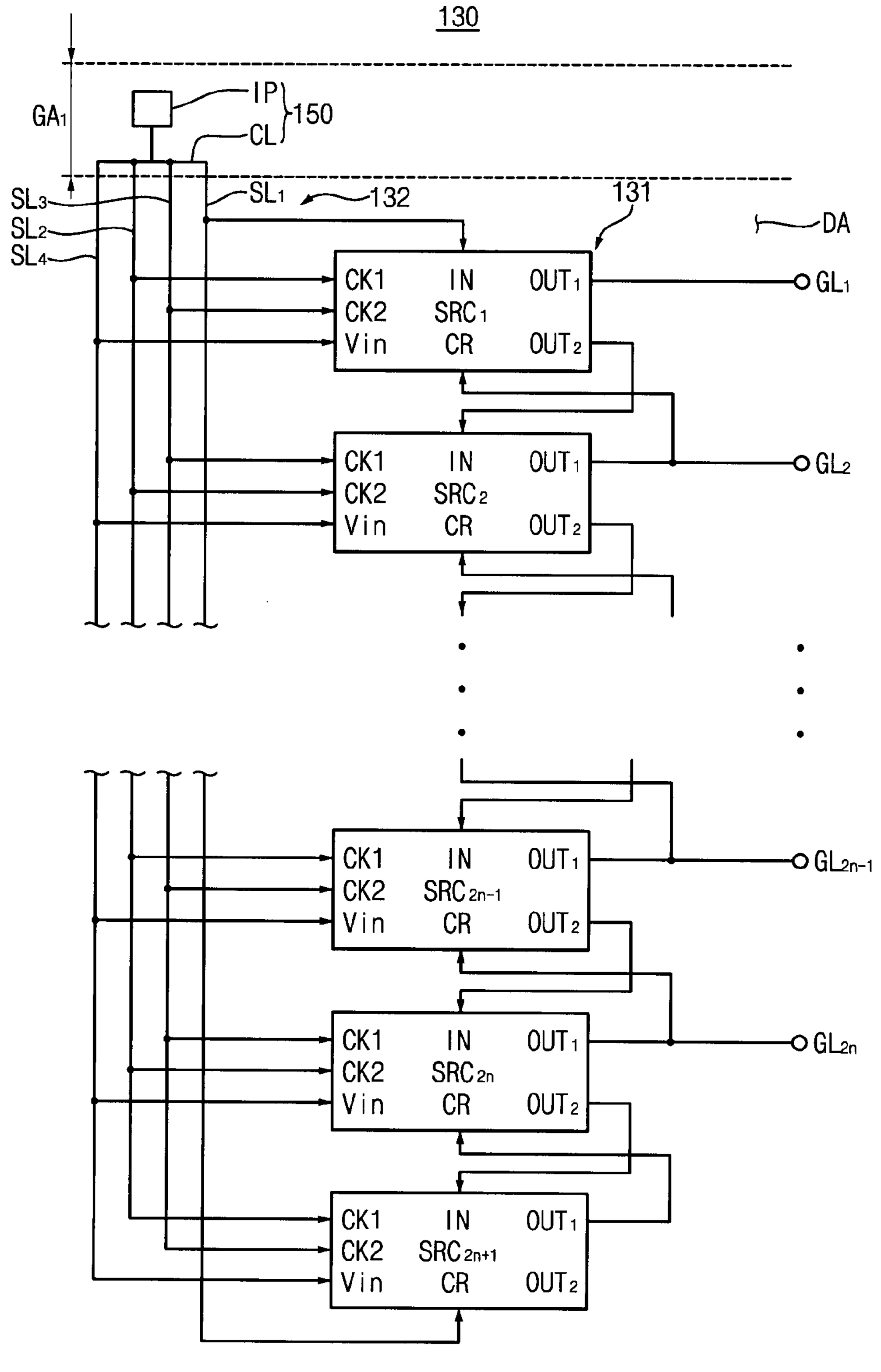
FIG. 6 is a block diagram showing the exemplary gate driving circuit shown in FIG. 1.
Figure 7:
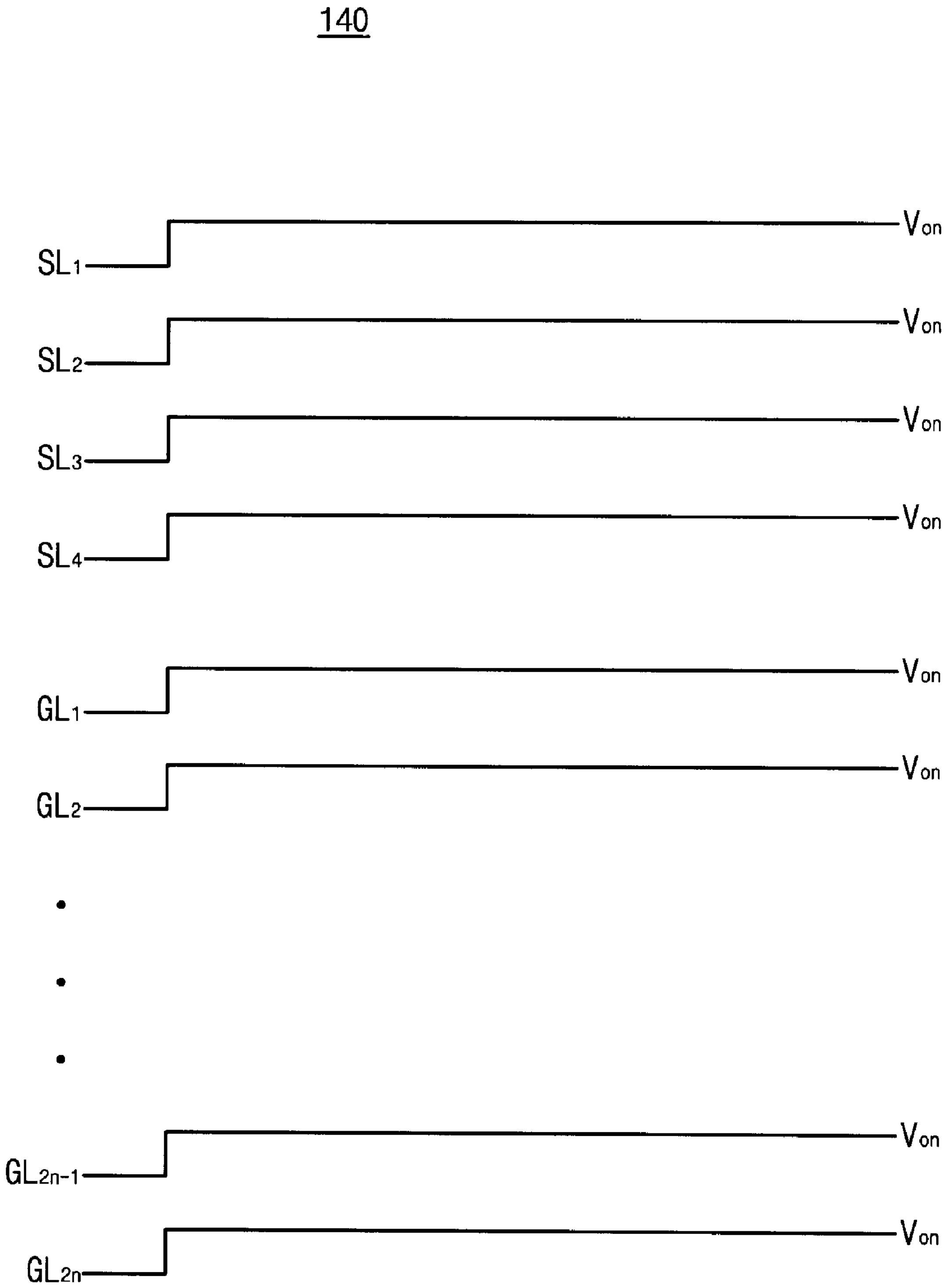
FIG. 7 is an input/output waveform diagram of the exemplary gate driving circuit shown in FIG. 6.

FIG. 6 is a block diagram showing the exemplary gate driving circuit shown in FIG. 1. FIG. 7 is an input/output waveform diagram of the exemplary gate driving circuit shown in FIG. 6.

Referring to FIG. 6, the gate driving circuit 130 includes a wire portion 132 receiving various signals externally provided and a circuit portion 131 outputting a gate signal in response to the various signals from the wire portion 132.

The circuit portion 131 includes first to (2n+1)-th stages SRC1 to SRC2n+1 connected one after another to the wire portion 132 to sequentially output the gate signal to the first to 2n-th gate lines GL1 to GL2n. In the present embodiment, 'n' is an even number.

Each of the first to (2n+1)-th stages SRC1 to SRC2n+1 includes a first clock terminal CK1, a second clock terminal CK2, a first input terminal IN, a control terminal CR, a voltage terminal Vin, a first output terminal OUT1, and a second output terminal OUT2.

Odd-numbered stages SRC1, . . . , SRC2n−1, and SRC2n+1 of the first to (2n+1)-th stages receive a first clock signal through the first clock terminal CK1 thereof, and even-numbered stages SRC2 to SRC2n of the first to (2n+1)-th stages receive a second clock signal having an opposite phase to the first clock signal through the first clock terminal CK1 thereof. Also, the odd-numbered stages SRC1, . . . , SRC2n−1, and SRC2n+1 receive the second clock signal through the second clock terminal CK2 thereof, and the even-numbered stages SRC2 to SRC2n receive the first clock signal through the second clock terminal CK2 thereof.

The first input terminal IN of each of the first to (2n+1)-th stages SRC1 to SRC2n+1 receives a second output signal outputted from a second output terminal OUT2 of a previous stage. The first stage SRC1 receives a start signal from the wire portion 132 through the first input terminal IN thereof to start the circuit portion 131.

Each of the first to (2n+1)-th stages receives the first output signal from an output terminal OUT1 of a next stage through the control terminal CR thereof. The (2n+1)-th stage SRC2n+1 is a dummy stage so as to apply the first output signal from the output terminal OUT1 thereof to the control terminal CR of the 2n-th stage SRC2n. The (2n+1)-th stage receives the start signal STV via the wire portion 132 through the control terminal CR thereof.

The first to (2n+1)-th stages SRC1 to SRC2*n*+1 receive the second driving voltage through the voltage terminal Vin.

The odd-numbered stages SRC1, . . . , SRC2*n*−1 and SRC2*n*+1 output the first clock signal CKV through the first and second output terminals OUT1 and OUT2 thereof, and the even-numbered stages SRC2 to SRC2*n* output the second clock signal CKVB through the first and second output terminals OUT1 and OUT2 thereof. The gate signal sequentially outputted from the output terminal OUT1 of each of the first to 2n-th stages SRC1 to SRC2*n* is applied to the first to 2n-th gate lines GL1 to GL2*n*.

The wire portion 132 includes a start signal line SL1, a first clock line SL2, a second clock line SL3, and a voltage line SL4, which are substantially parallel to each other, and which may further be substantially perpendicular to the gate lines.

The start signal line SL1 applies the start signal to the first input terminal IN of the first stage SRC1 and the control terminal CR of the (2n+1)-th stage SRC2*n*+1.

The first clock line SL2, the second clock line SL3, and the voltage line SL4 receive the first clock signal, the second clock signal, and the second driving voltage, respectively. The start signal line SL1, the second clock line SL3, the first clock line SL2, and the voltage line SL4 are adjacent to the circuit portion 131 in that order.

In order to inspect the gate driving circuit 130 and the pixel part 120, the array substrate 100 further includes a dummy inspection circuit 150 formed in a grinding area GA1. The grinding area GA1 may be connected to the wire portion 132 and positioned prior to the first gate line GL1.

The dummy inspection circuit 150 includes a connection line CL and an inspection pad IP. The connection line CL connects the start signal line SL1, the first clock line SL2, the second clock line SL3 and the voltage line SL4 to each other. The inspection pad IP is extended from the connection line CL to receive the first driving voltage Von (see FIG. 7).

The inspection pad IP of the dummy inspection circuit 150 receives the first driving voltage Von while the gate driving circuit 130 and the pixel part 120 are inspected. The first driving voltage Von inputted through the inspection pad IP is applied to the start signal line SL1, the first clock line SL2, the second clock line SL3 and the voltage line SL4 through the connection line CL.

As further shown in FIG. 7, the circuit portion 131 outputs the first driving voltage Von to the first to 2n-th gate lines GL1 to GL2*n* in response to the first driving voltage Von applied through the start signal line SL1, the first clock line SL2, the second clock line SL3, and the voltage line SL4. Thus, the pixels connected to the first to 2n-th gate lines GL1 to GL2*n* are turned on in response to the first driving voltage Von. The dummy inspection circuit 150 may inspect the gate driving circuit 130 and the pixel part 120.

After the inspection of the gate driving circuit 130 and the pixel part 120 is completed, the first grinding area GA1 of the array substrate 100 is grinded, so that the connection line CL and the inspection pad IP formed in the first grinding area GA1 are removed from the array substrate 100. Thus, via the removal of the connection line CL, the start signal line SL1, the first clock line SL2, the second clock line SL3, and the voltage line SL4 are electrically disconnected to each other by the grinding process.

In the present embodiment, the array substrate 100 includes the inspection circuit 140 and the dummy inspection circuit 150. When inspecting the array substrate 100 using the inspection circuit 140 and the dummy inspection circuit 150, determining whether defects are caused by the pixel part 120 or the gate driving circuit 130 may be accurately determined. Therefore, the inspection efficiency may be improved and the array substrate 100 may be easily repaired.

Figure 8:
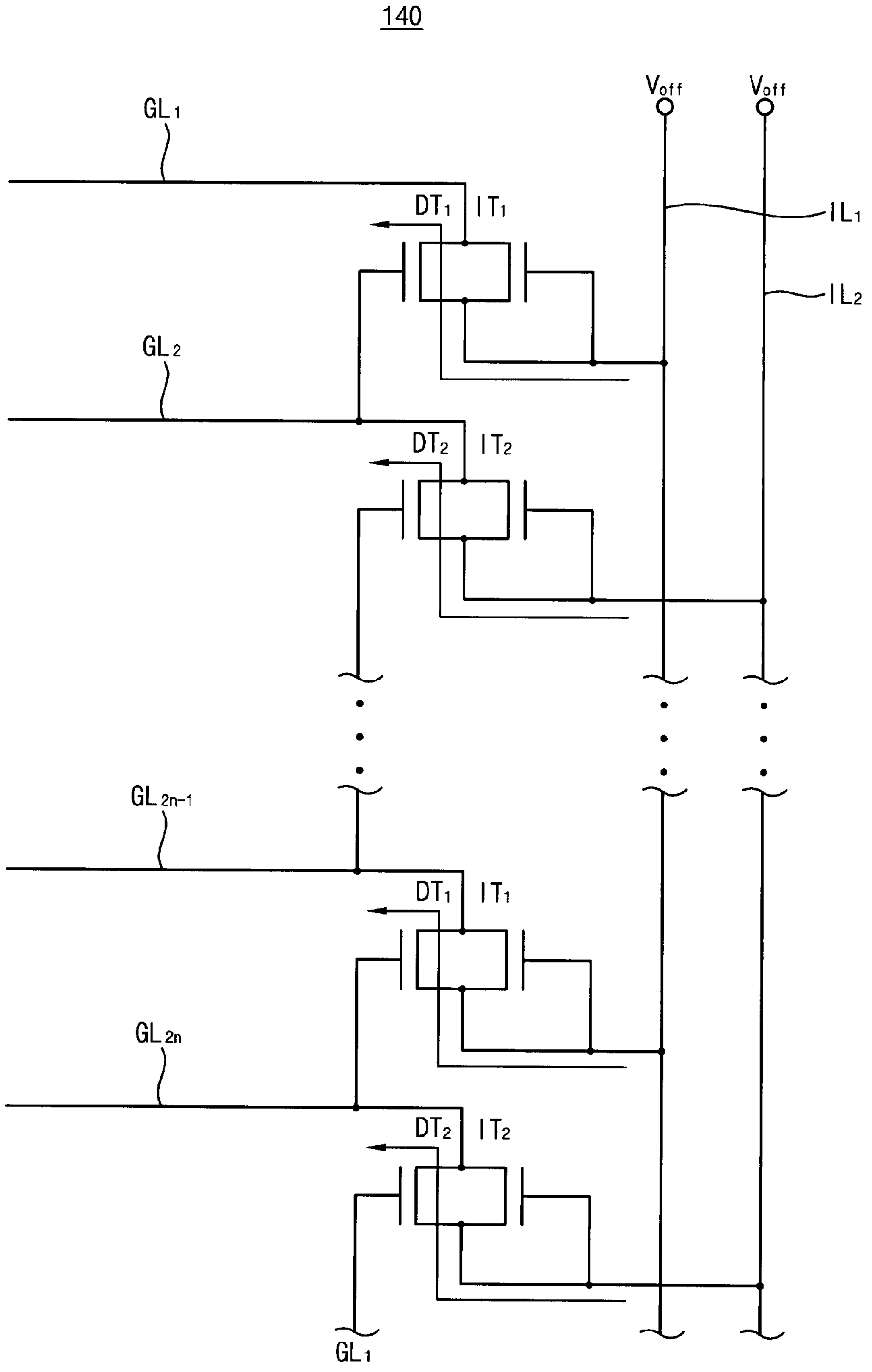
FIG. 8 is a circuit diagram illustrating an operation of an exemplary inspection circuit shown in FIG. 1.
Figure 9:
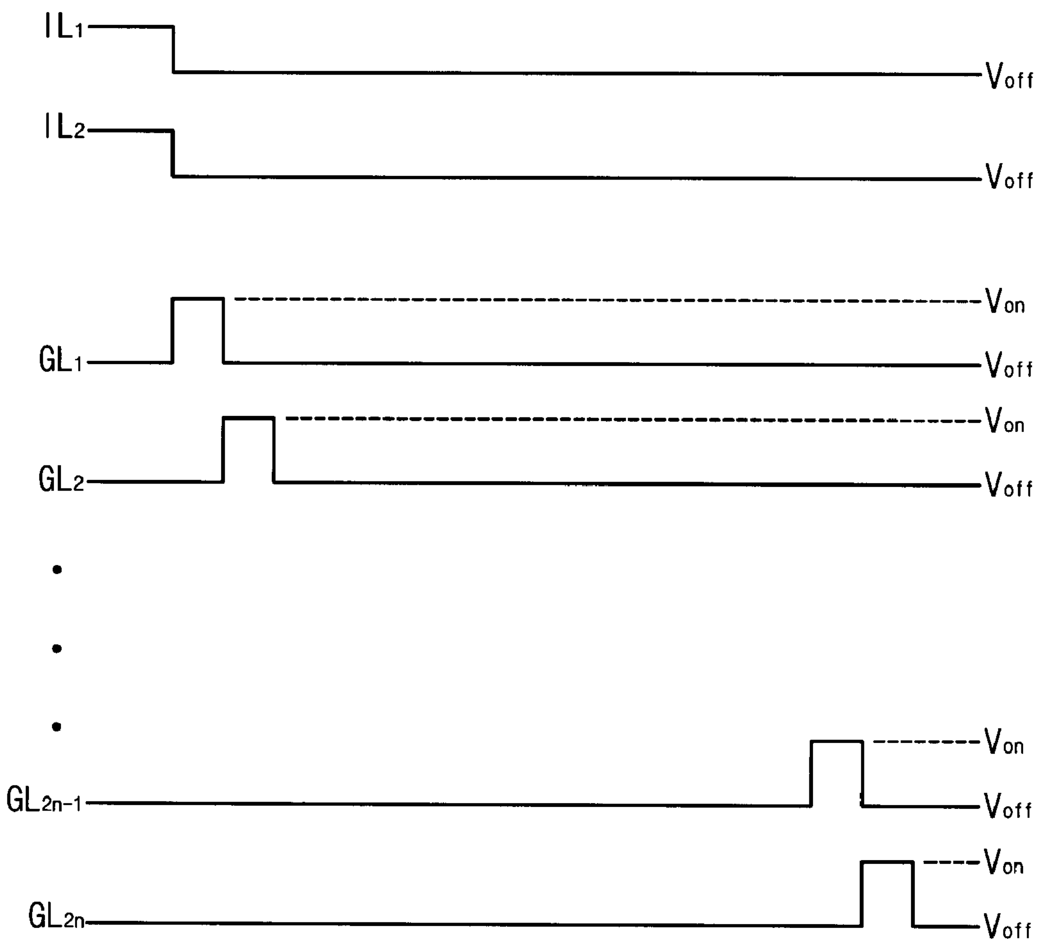
FIG. 9 is an input/output waveform diagram of the exemplary inspection circuit shown in FIG. 8.

FIG. 8 is a circuit diagram illustrating an operation of an exemplary inspection circuit shown in FIG. 1. FIG. 9 is an input/output waveform diagram of the exemplary inspection circuit shown in FIG. 8.

Referring to FIGS. 8 and 9, after completion of the inspection process, such as after the second inspection, the first and second inspection lines IL1 and IL2 both receive the second driving voltage Voff while the array substrate 100 is driven. The first odd-numbered switching device IT1 of the inspection circuit 140 is turned off, via the second and third electrodes of the first odd-numbered switching device IT1, in response to the second driving voltage Voff applied through the first inspection line IL1, and the first even-numbered switching device IT2 is also turned off, via the second and third electrodes of the first even-numbered switching device IT2, in response to the second driving voltage Voff applied through the second inspection line IL2.

The first to 2n-th gate lines GL1 to GL2*n* sequentially receive the gate signal outputted from the gate driving circuit 130 (see FIG. 1).

Because the first odd-numbered switching device IT1 and the first even-numbered switching device IT2 are turned off, the second odd-numbered switching device DT1 and the second even-numbered switching device DT2 must be turned on to deliver the second driving voltage Voff to the odd and even-numbered gate lines, respectively. Thus, the second odd-numbered switching device DT1 of the inspection circuit 140 is turned on, via the second electrode of the second odd-numbered switching device DT1, in response to the gate signal having a same voltage level as the first driving voltage Von applied to the next even-numbered gate lines GL2 to GL2*n*, so that the second odd-numbered switching device DT1 applies the second driving voltage Voff from the first inspection line IL1, via the third electrode of the second odd-numbered switching device DT1, to the odd-numbered gate lines GL1 to GL2*n*−1, via the first electrode of the second odd-numbered switching device DT1. Also, the second even-numbered switching device DT2 of the inspection circuit 140 is turned on, via the second electrode of the second even-numbered switching device DT2, in response to the gate signal having a same voltage level as the first driving voltage Von applied to the next odd-numbered gate lines GL1 to GL2*n*−1, so that the second even-numbered switching device DT2 applies the second driving voltage Voff from the second inspection line IL2, via the third electrode of the second even-numbered switching device DT2, to the even-numbered gate lines GL2 to GL2*n*, via the first electrode of the second even-numbered switching device DT2.

As a result, the second odd-numbered switching device DT1 and the second even-numbered switching device DT2 are used during the first and second inspections, as previously described, and further the second odd-numbered switching device DT1 and the second even-numbered switching device DT2 discharge the signals applied to the gate lines GL1 to GL2*n* until the voltage level of the gate lines GL1 to GL2*n* falls to the second driving voltage Voff, as demonstrated by FIG. 9.

Figure 10:
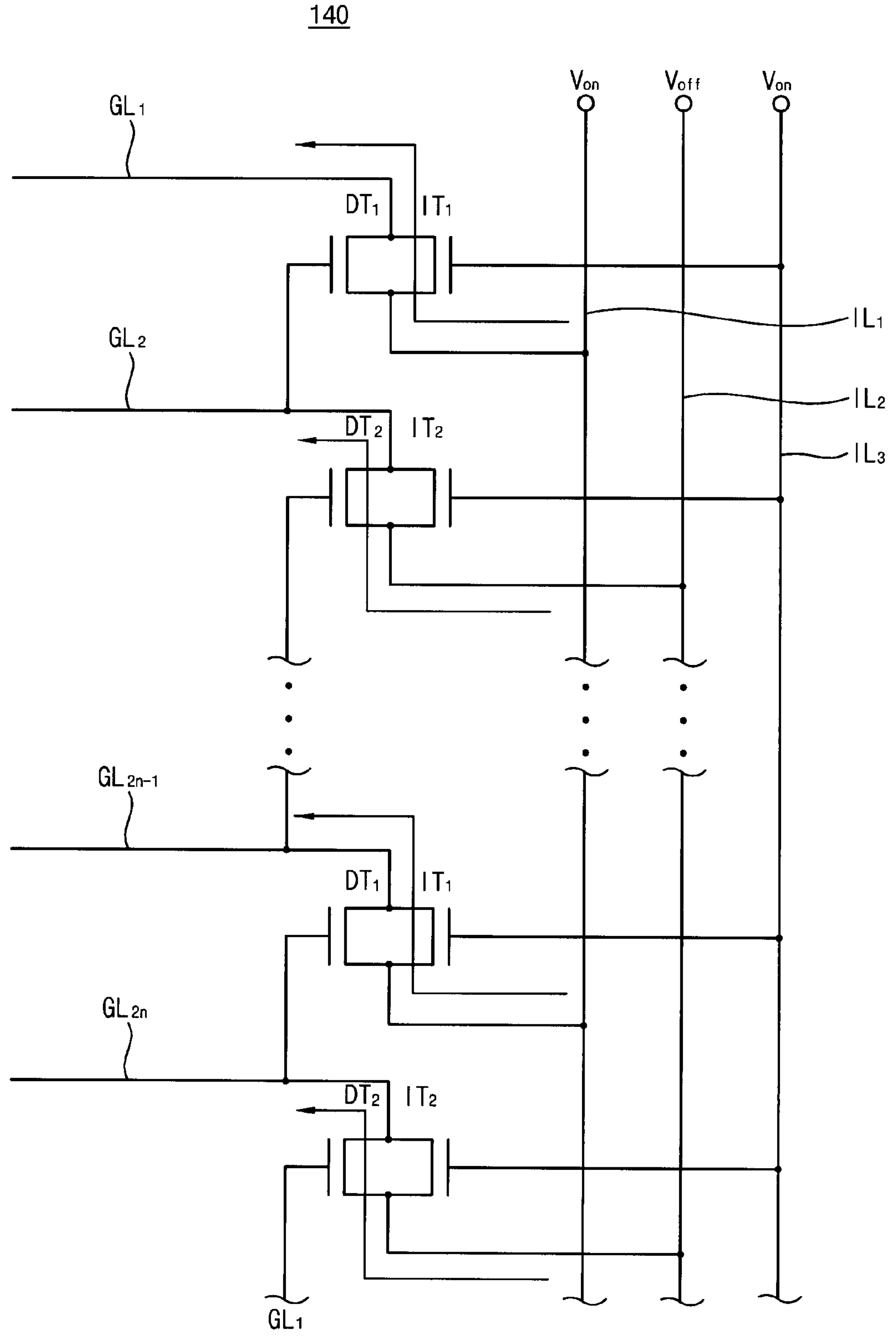
FIG. 10 is a circuit diagram illustrating an operation of an exemplary inspection circuit shown in FIG. 1.
Figure 11:
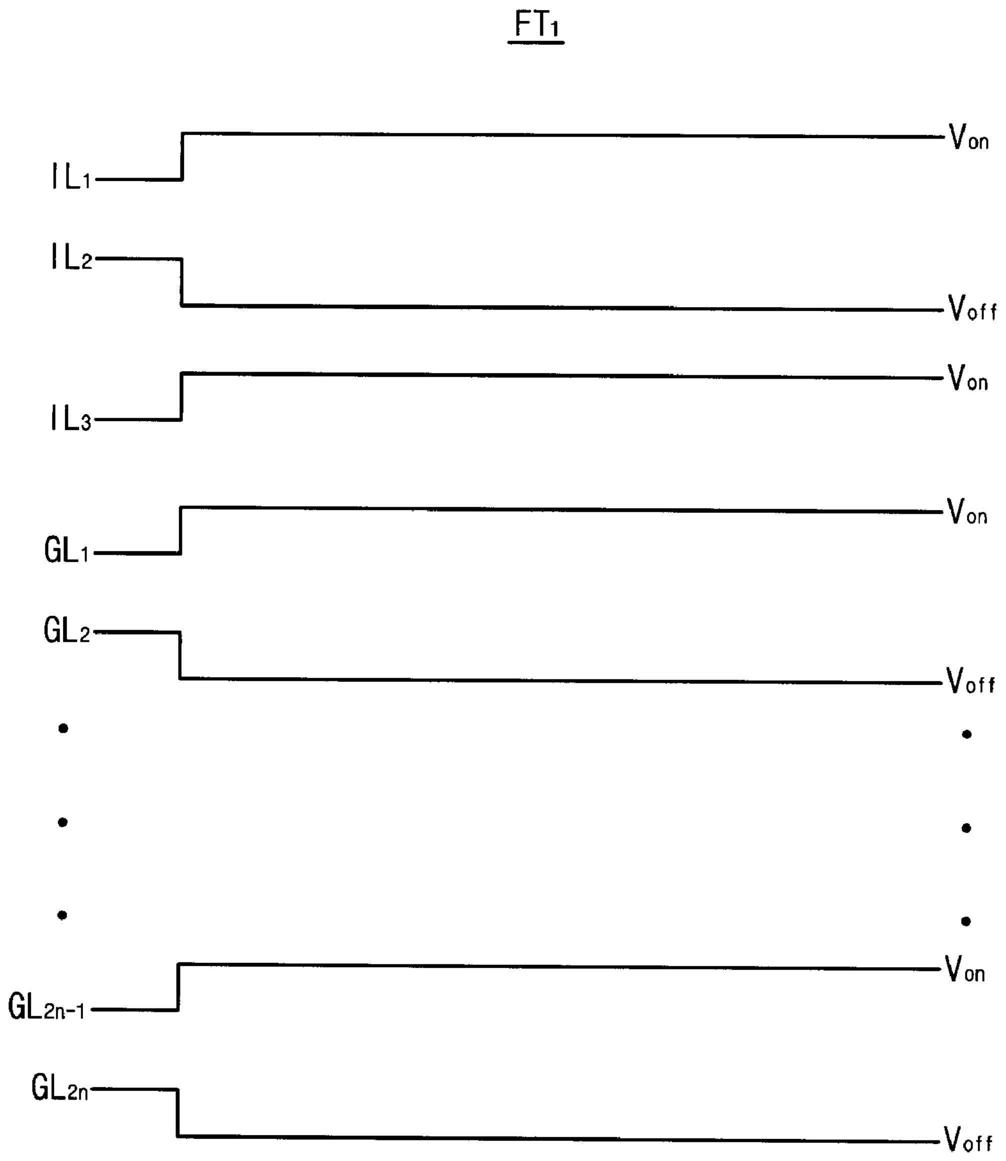
FIG. 11 is an input/output waveform diagram of the exemplary inspection circuit shown in FIG. 10.

FIG. 10 is a circuit diagram illustrating an operation of an exemplary inspection circuit shown in FIG. 1. FIG. 11 is an input/output waveform diagram of the exemplary inspection circuit shown in FIG. 10.

Referring to FIGS. 10 and 11, an inspection circuit 140 includes a first odd-numbered switching device IT1, a first even-numbered switching device IT2, a second odd-numbered switching device DT1, a second even-numbered switching device DT2, a first inspection line IL1, a second inspection line IL2, and a third inspection line IL3.

The first odd-numbered switching device IT1 has a first electrode connected to the odd-numbered gate lines GL1 to GL2*n*−1, a second electrode connected to the third inspection line IL3, and a third electrode connected to the first inspection line IL1. The first even-numbered switching device IT2 has a first electrode connected to the even-numbered gate lines GL2 to GL2*n*, a second electrode connected to the third inspection line IL3, and a third electrode connected to the second inspection line IL2.

The second odd-numbered switching device DT1 has a first electrode connected to the odd-numbered gate lines GL1 to GL2*n*−1, a second electrode connected to the next even-numbered gate lines GL2 to GL2*n*, and a third electrode connected to the first inspection line IL1. The first electrode of the second odd-numbered switching device DT1 may be the same electrode as the first electrode of the first odd-numbered switching device IT1, and the third electrode of the second odd-numbered switching device DT1 may be the same electrode as the third electrode of the first odd-numbered switching device IT1. The second even-numbered switching device DT2 has a first electrode connected to the even-numbered gate lines GL2 to GL2*n*, a second electrode connected to the next odd-numbered gate lines, and a third electrode connected to the second inspection line IL2. The first electrode of the second even-numbered switching device DT2 may be the same electrode as the first electrode of the first even-numbered switching device IT2, and the third electrode of the second even-numbered switching device DT2 may be the same electrode as the third electrode of the first even-numbered switching device IT2.

During a first inspection FT1, as shown in FIG. 11, where the odd-numbered gate lines GL1 to GL2*n*−1 are inspected, the first inspection line IL1 receives a first driving voltage Von, the second inspection line IL2 receives a second driving voltage Voff, and the third inspection line IL3 receives the first driving voltage Von.

During the first inspection FT1, the first odd-numbered switching device IT1 applies the first driving voltage Von to the odd-numbered gate lines GL1 to GL2*n*−1 in response to the first driving voltage Von inputted through the first and third inspection lines IL1 and IL3, via the third and second electrodes, respectively, of the first odd-numbered switching device IT1. Also during the first inspection FT1, the second even-numbered switching device DT2 applies the second driving voltage Voff from the second inspection line IL2, via the third electrode of the second even-numbered switching device DT2, to the even-numbered gate lines GL2 to GL2*n*, via the first electrode of the second even-numbered switching device DT2, in response to the first driving voltage Von inputted through the third inspection line IL3. Thus, during the first inspection time FT1, the odd-numbered pixels connected to the odd-numbered gate lines GL1 to GL2*n*−1 are turned on, but the even-numbered pixels connected to the even numbered gate lines GL2 to GL2*n* are turned off.

Also during the first inspection FT1, the second odd-numbered switching device DT1 is turned off, via the second electrode of the second odd-numbered switching device DT1, in response to the second driving voltage Voff applied to the even-numbered gate lines GL2 to GL2*n*, and the first even-numbered switching device IT2 is turned off, via the third electrode of the first even-numbered switching device IT2, in response to the second driving voltage Voff applied to the second inspection line IL2.

Thus, the odd-numbered pixels connected to the odd-numbered gate lines GL1 to GL2*n*−1 are driven during the first inspection FT1, so that the odd-numbered pixels and the odd-numbered gate lines GL1 to GL2*n*−1 may become targets for inspection.

In one exemplary embodiment, the first and second odd-numbered switching devices IT1 and DT1, and the first and second even-numbered switching devices IT2 and DT2 are amorphous silicon a-Si transistors, and substantially simultaneously formed with the thin film transistor 111. Thus, a time for completing a manufacturing method of the array substrate 100 would not be increased, or would at least not be significantly increased, when the array substrate 100 is manufactured to include the inspection circuit 140.

Figure 12:
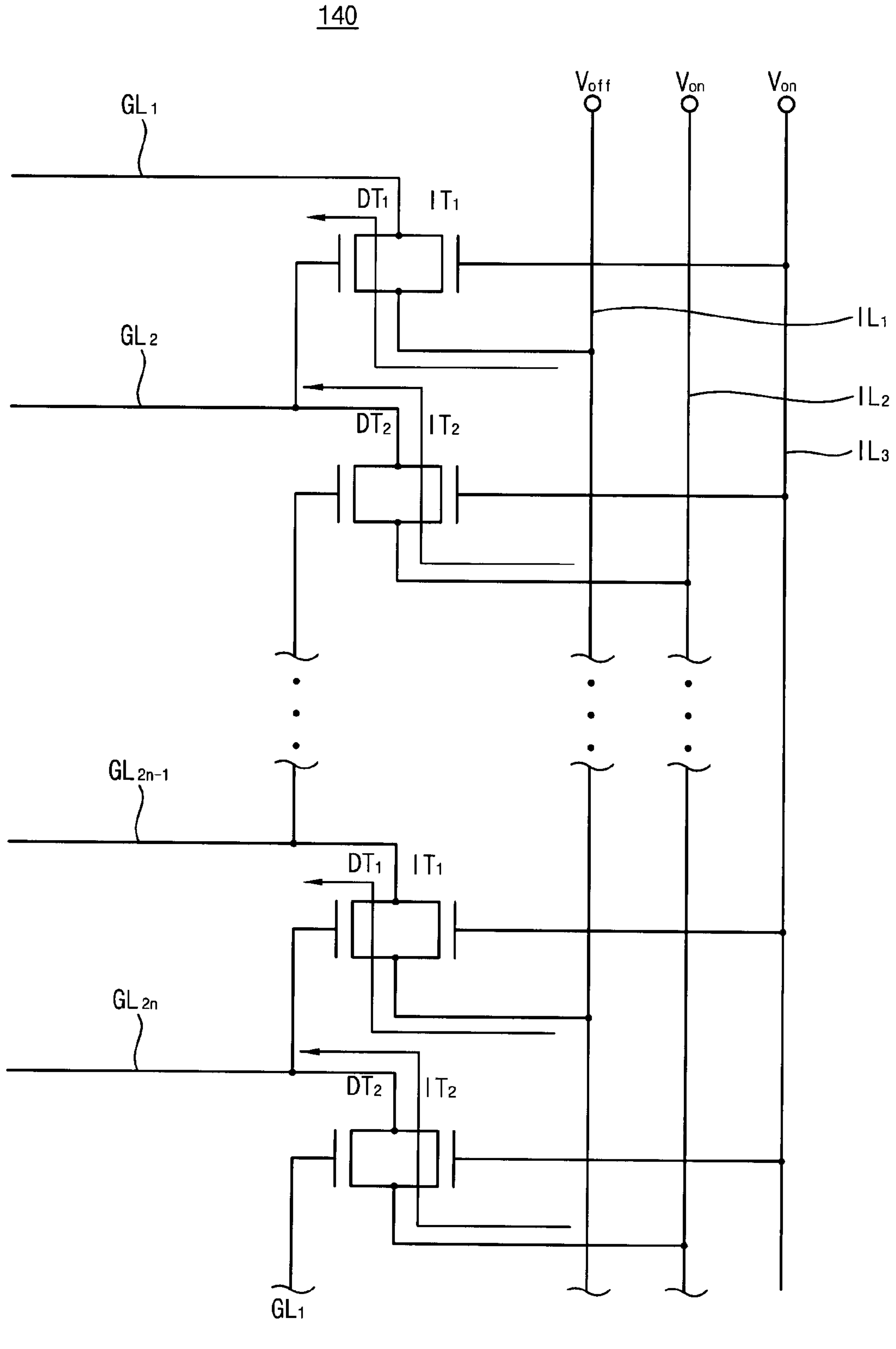
FIG. 12 is a circuit diagram illustrating an operation of an exemplary inspection circuit shown in FIG. 1.
Figure 13:
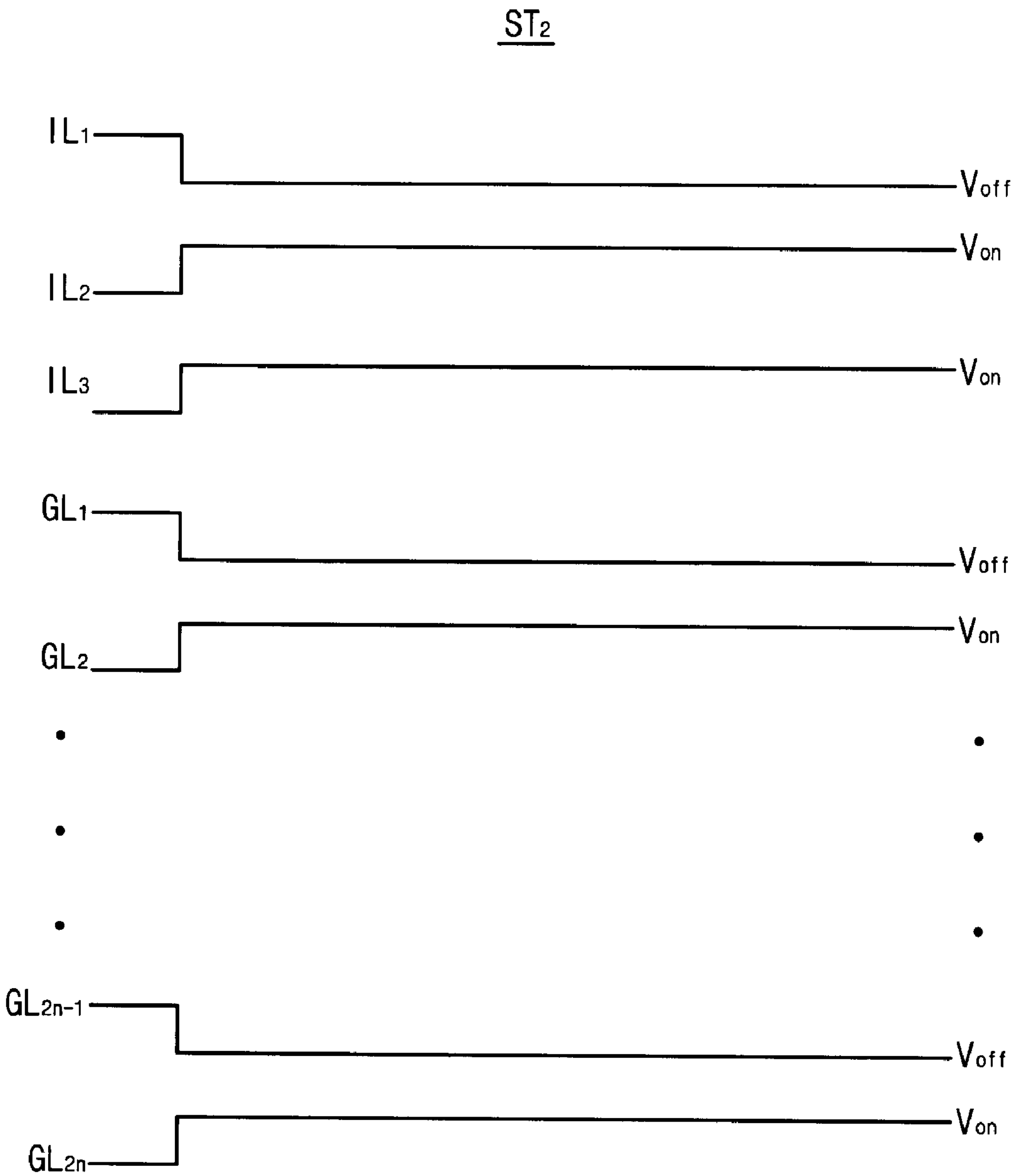
FIG. 13 is an input/output waveform diagram of the exemplary inspection circuit shown in FIG. 12.

FIG. 12 is a circuit diagram illustrating an operation of an exemplary inspection circuit shown in FIG. 1. FIG. 13 is an input/output waveform diagram of the exemplary inspection circuit shown in FIG. 12.

Referring to FIGS. 12 and 13, during the second inspection ST2 where the even-numbered gate lines GL2 to GL2*n* are inspected, the first inspection line IL1 receives the second driving voltage Voff, the second inspection line IL2 receives the first driving voltage Von, and the third inspection line IL3 also receives the first driving voltage Von.

During the second inspection ST2, the first even-numbered switching device IT2 applies the first driving voltage Von, via the first electrode of the first even-numbered switching device IT2, to the even-numbered gate lines GL2 to GL2*n* in response to the first driving voltage Von inputted through the second and third inspection lines IL2 and IL3 to the third and second electrodes, respectively, of the first even-numbered switching device IT2. The second odd-numbered switching device DT1 applies the second driving voltage Voff inputted through the first inspection line IL1, via the third electrode of the second odd-numbered switching device DT1, to the odd-numbered gate lines GL1 to GL2*n*−1, via the first electrode of the second odd-numbered switching device DT1, in response to the first driving voltage Von applied through the third inspection line IL3.

Thus, during the second inspection ST2, the even-numbered pixels connected to the even-numbered gate lines GL2 to GL2*n* are turned on, but the odd-numbered pixels connected to the odd-numbered gate lines GL1 to GL2*n*−1 are turned off.

During the second inspection ST2, the second even-numbered switching device DT2 is turned off, via the second electrode of the second even-numbered switching device DT2, in response to the second driving voltage Voff applied to the odd-numbered gate lines GL1 to GL2*n*−1, and the first odd-numbered switching device IT1 is turned off, via the third electrode of the first odd-numbered switching device IT1, in response to the second driving voltage Voff applied to the first inspection line IL1.

Thus, only even-numbered pixels connected to the even-numbered gate lines GL2 to GL2*n* are driven during the second inspection ST2, so that the even-numbered pixels and the even-numbered gate lines GL2 to GL2*n* may be inspected.

The inspection circuit 140 inspects the first to 2n-th gate lines GL1 to GL2*n* divided into two groups during the first and second inspections FT1 and ST2, respectively, so that positions and causes for the defects of the pixel part 120 may be accurately detected. As a result, the inspection circuit 140 may have high inspecting efficiency.

Figure 14:
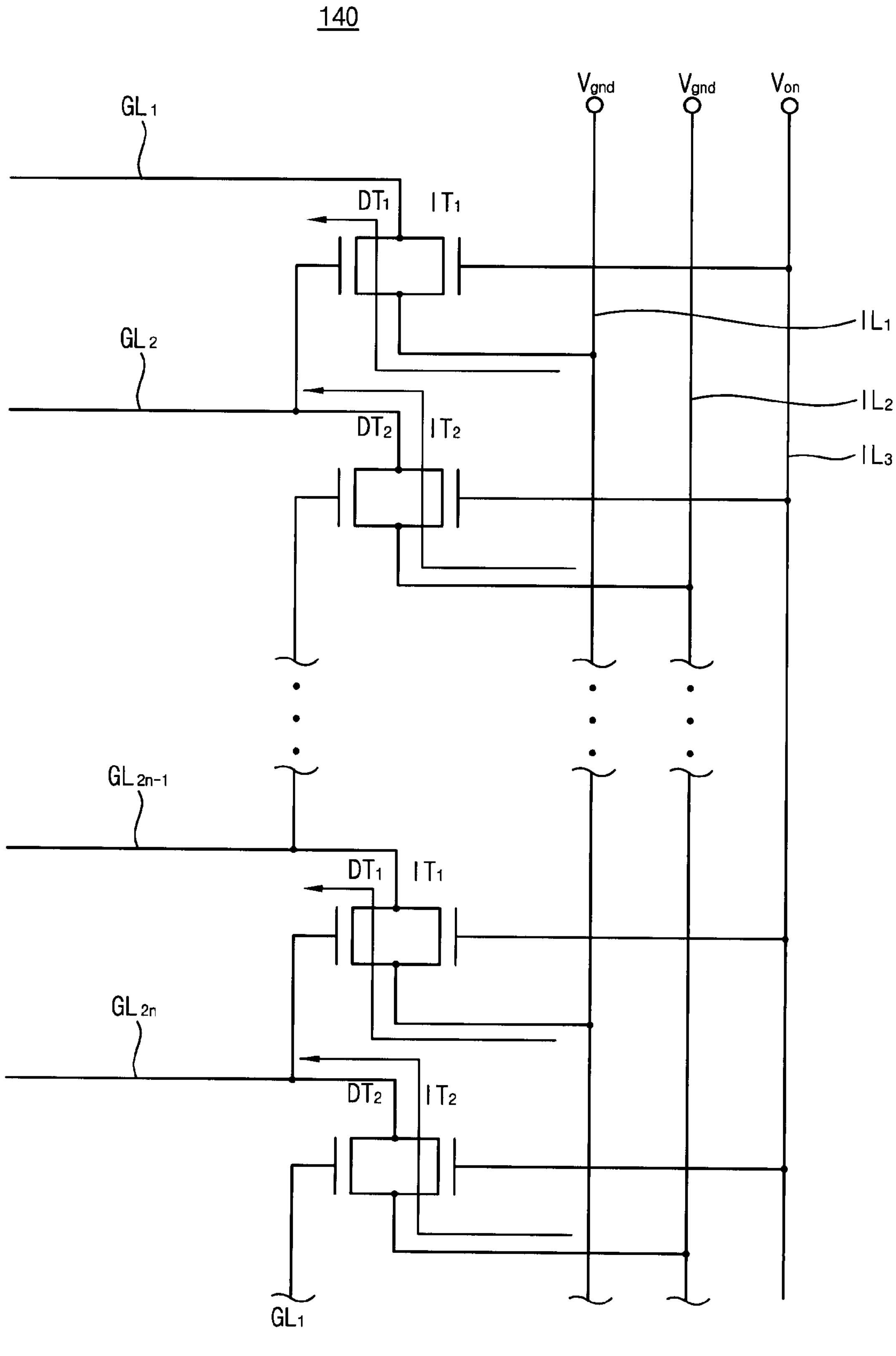
FIG. 14 is a circuit diagram illustrating an operation of an exemplary inspection circuit shown in FIG. 1.
Figure 15:
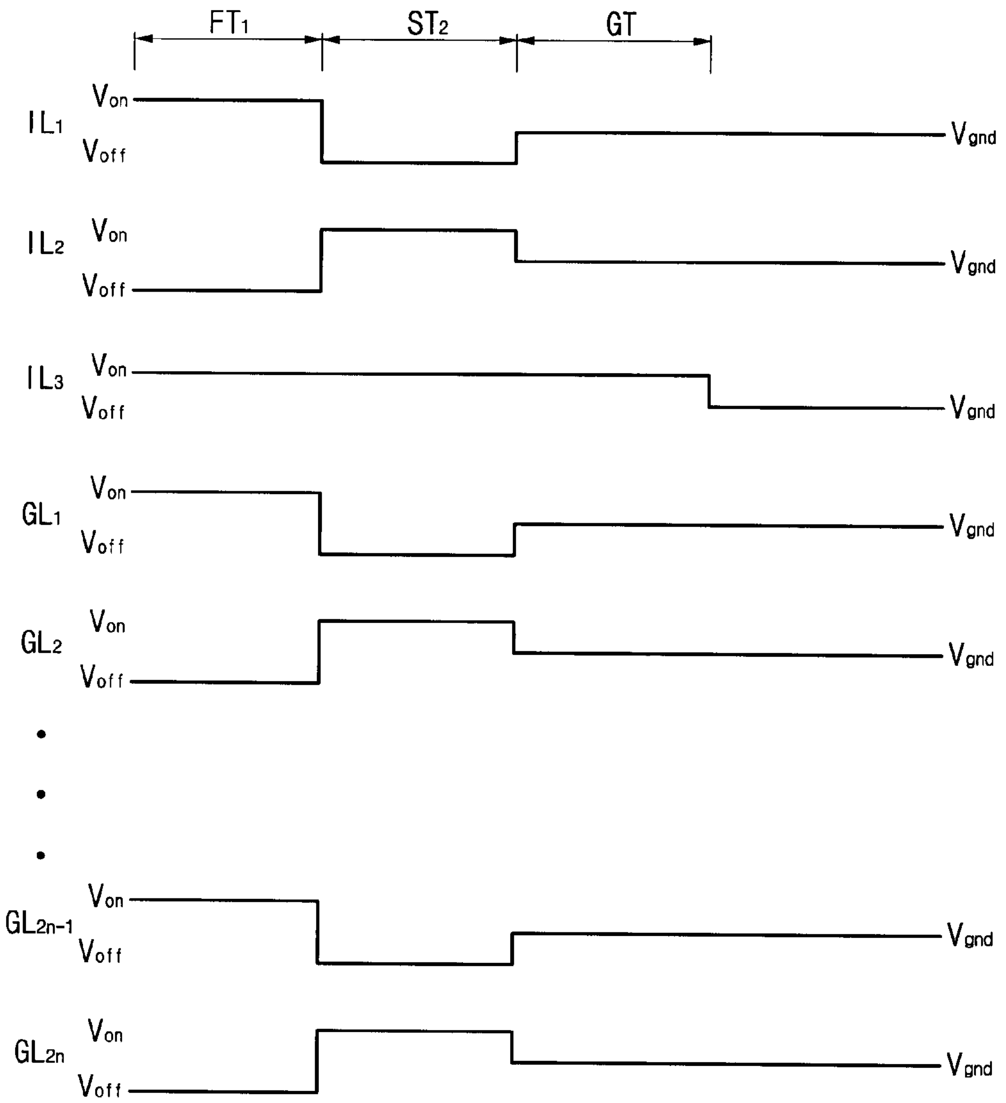
FIG. 15 is an input/output waveform diagram of the exemplary inspection circuit shown in FIG. 14.

FIG. 14 is a circuit diagram illustrating an operation of an exemplary inspection circuit shown in FIG. 1. FIG. 15 is an input/output waveform diagram of the exemplary inspection circuit shown in FIG. 14.

Referring to FIGS. 14 and 15, during a grounding GT where the gate lines GL1 to GL2$n$ are grounded, the first inspection line IL1 receives a ground voltage Vgnd, the second inspection line IL2 receives the ground voltage Vgnd, and the third inspection line IL3 receives the first driving voltage Von.

During the grounding GT, the first odd-numbered switching device IT1 applies the ground voltage Vgnd inputted, via the third electrode of the first odd-numbered switching device IT1, through the first inspection line IL1 to the odd-numbered gate lines GL1 to GL2$n$−1, via the first electrode of the first odd-numbered switching device IT1, in response to the first driving voltage Von inputted through the third inspection line IL3 via the second electrode of the first odd-numbered switching device IT1. Also, the second even-numbered switching device DT2 applies the ground voltage Vgnd inputted, via the third electrode of the second even-numbered switching device DT2, through the second inspection line IL2 to the even-numbered gate lines GL2 to GL2$n$, via the first electrode of the second even-numbered switching device DT2, in response to the first driving voltage Von inputted through the third inspection line IL3.

Thus, during the grounding GT, all of the gate lines GL1 to GL2$n$ receive the ground voltage Vgnd, so that the pixels connected to the gate lines GL1 to GL2$n$ are turned off in response to the ground voltage Vgnd.

When the gate lines GL1 to GL2$n$ are grounded, such as after the grounding GT, the third inspection line IL3 receives the ground voltage Vgnd. Thus, the first odd-numbered switching device IT1 and the first even-numbered switching device IT2 connected to the third inspection line IL3 are both turned off via their second electrodes, respectively, thereby grounding the gate lines GL1 to GL2$n$ until the gate lines GL1 to GL2$n$ are turned on by the gate driving circuit 130 (see FIG. 1).

Figure 16:
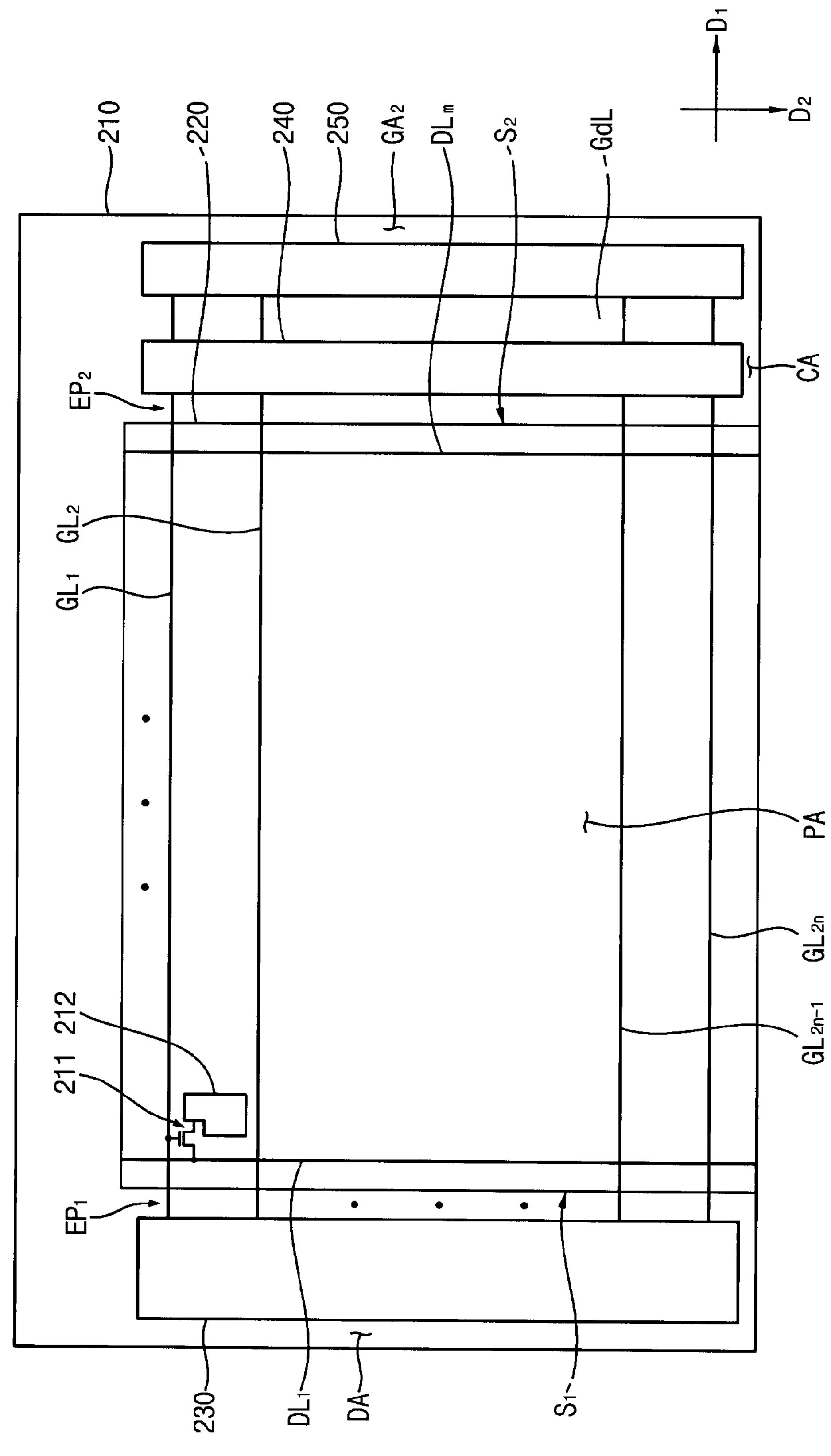
FIG. 16 is a plan view showing another exemplary embodiment of an array substrate according to the present invention.
Figure 17:
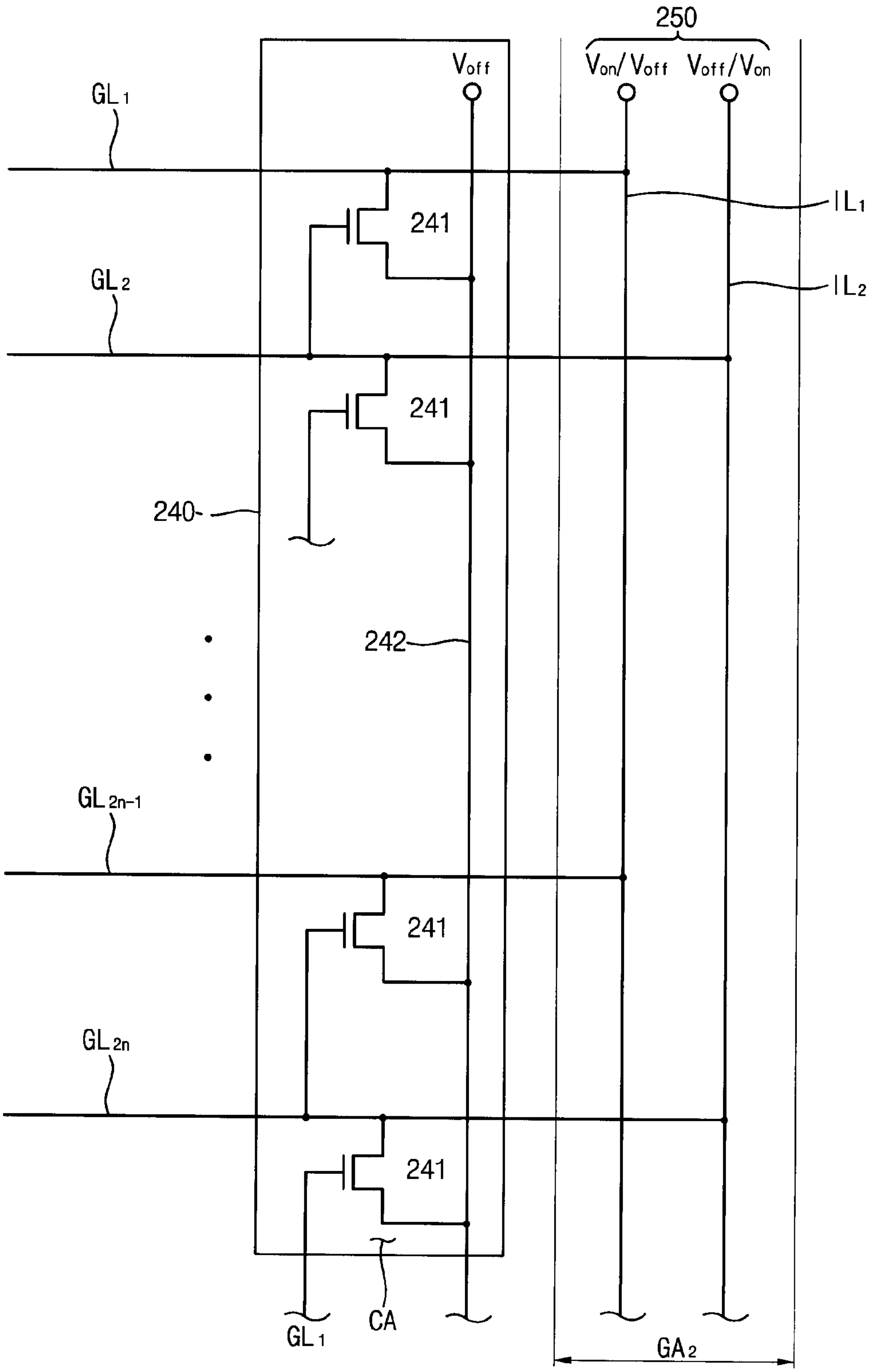
FIG. 17 is a circuit diagram showing an exemplary discharge circuit and an exemplary inspection circuit of FIG. 16.

FIG. 16 is a plan view showing another exemplary embodiment of an array substrate according to the present invention. FIG. 17 is a circuit diagram showing an exemplary discharge circuit and an exemplary inspection circuit of FIG. 16.

Referring to FIGS. 16 and 17, an array substrate 200 includes a substrate 210, a pixel part 220, a gate driving circuit 230, a discharge circuit 240, and an inspection part 250.

The substrate 210 includes a pixel area PA in which the pixel part 220 is formed, a driving area DA in which the gate driving circuit 230 is formed, a discharge area CA in which the discharge circuit 240 is formed, and a second grinding area GA2 in which the inspection part 250 is formed. The driving area DA is adjacent to a first side S1 of the pixel area PA, the discharge area CA is adjacent to a second side S2 opposite to the first side S1 of the pixel area PA, and the second grinding area GA2 is disposed at an outer side of the discharge area CA.

The pixel part 220 includes first to 2n-th gate lines GL1 to GL2$n$ extending in the first direction D1, first to m-th data lines DL1 to DLm, extending in the second direction D2, and a plurality of pixels. Each of the pixels includes a TFT 211 and a pixel electrode 212.

The gate driving circuit 230 is electrically connected to a first end EP1 of the first to 2n-th gate lines GL1 to GL2$n$. The gate driving circuit 230 sequentially outputs the gate signal to the first to 2n-th gate lines GL1 to GL2$n$ while the array substrate 200 is driven.

The discharge circuit 240 includes a discharge switching device 241 and a discharge line 242. The discharge switching device 241 has a first electrode connected to corresponding gate lines GL1 to GL2$n$, a second electrode connected to the next gate lines GL2 to GL2$n$, and a third electrode connected to the discharge line 242. The discharge line 242 receives the second driving voltage Voff and may be extended generally perpendicularly to the gate lines GL1 to GL2$n$.

During the driving of the array substrate 200, the discharge switching device 241 applies the second driving voltage Voff, that is applied to the discharge line 242 and to the third electrode of the discharge switching device 241, to a corresponding gate line, via the first electrode of the discharge switching device 241, in response to the gate signal applied to the next gate line received via the second electrode of the discharge switching device 241. Thus, the gate signal having a voltage level of the first driving voltage Von and applied to the corresponding gate line may fall to the voltage level of the second driving voltage Voff that is applied to the corresponding gate line via the first electrode of the discharge switching device 241.

The inspection part 250 includes a first inspection line IL1 electrically connected to the second end EP2 of the odd-numbered gate lines GL1 to GL2$n$−1 and a second inspection line IL2 electrically connected to a second end EP2 of the even-numbered gate lines GL2 to GL2$n$. During the first inspection where the odd-numbered gate lines GL1 to GL2$n$−1 are inspected, the first and second inspection lines IL1 and IL2 receive the first and second driving voltages Von and Voff, respectively.

During the first inspection, the odd-numbered pixels connected to the odd-numbered gate lines GL1 to GL2$n$−1 are turned on in response to the first driving voltage Von applied directly to the odd-numbered gate lines GL1 to GL2$n$−1 through the first inspection line IL1. On the contrary, during the first inspection, the even-numbered pixels of the even-numbered gate lines GL2 to GL2$n$ are turned off in response to the second driving voltage Voff applied directly to the even-numbered gate lines GL2 to GL2$n$ through the second inspection line IL2.

During the second inspection where the even-numbered gate lines GL2 to GL2$n$ are inspected, the first and second inspection lines IL1 and IL2 receive the first and second driving voltages Von and Voff, respectively. Thus, during the second inspection, the even-numbered pixels connected to the even-numbered gate lines GL2 to GL2$n$ are turned on in response to the first driving voltage Von applied directly to the even-numbered gate lines GL2 to GL2$n$ through the second inspection line IL2. On the contrary, the odd-numbered pixels connected to the odd-numbered gate lines GL1 to GL2$n$−1 are turned off in response to the second driving voltage Voff applied directly to the odd-numbered gate lines GL1 to GL2$n$−1 through the first inspection line IL1.

Thus, only odd-numbered gate lines GL1 to GL2$n$−1 are inspected during the first inspection, and only even-numbered gate lines GL2 to GL2$n$ are inspected during the second inspection.

The second grinding area GA2 in which inspection part 250 is formed is grinded after completion of the inspection process. The inspection part 250 formed in the second grinding area GA2 is removed from the array substrate 200 while the grinding area GA2 is grinded. Thus, only discharge circuit 240 is electrically connected to the second end EP2 of the first to 2n-th gate lines GL1 to GL2$n$ on the array substrate 200.

Figure 18:
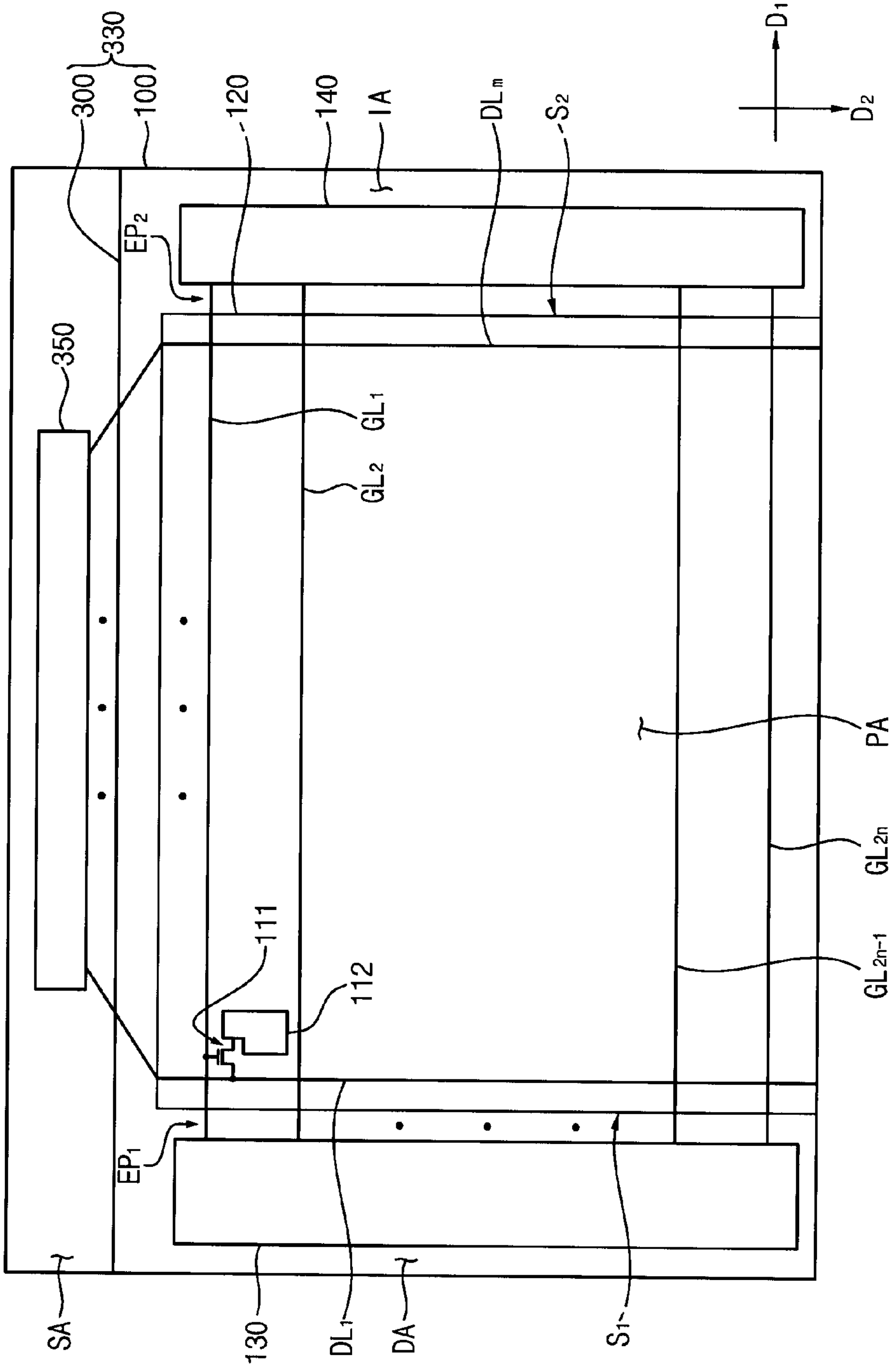
FIG. 18 is a plan view showing an exemplary embodiment of a display apparatus according to the present invention.

FIG. 18 is a plan view showing an exemplary embodiment of a display apparatus according to the present invention. In FIG. 18, the same reference numerals denote the same elements in FIG. 1, and thus any repetitive descriptions of the same elements will be omitted.

Referring to FIG. 18, a display apparatus 400 includes a display panel 330. The display panel 330 includes an array substrate 100, a substrate 300 facing the array substrate 100, and a liquid crystal layer (not shown) disposed between the array substrate 100 and the substrate 300.

The display panel 300 includes an effective display area on which an image is displayed and a non-effective display area on which the image is not displayed. The pixel area PA of the array substrate 100 is in the effective display area, and the driving area DA and the inspection area IA are in the non-effective display area.

The non-effective display area further includes a peripheral area SA adjacent to ends of the first to m-th data lines DL1 to DLm of the array substrate 100 closest to the first gate line GL1. In order to apply the data signal to the first to m-th data lines DL1 to DLm, a chip-type data driving circuit 350 is mounted onto the array substrate 100 in a location corresponding to the peripheral area SA.

Although not shown in FIG. 18, the substrate 300 includes a color filter layer having red, green, and blue (RGB) color pixels and a common electrode facing each pixel electrode 112 on the array substrate 100.

According to the array substrate and the display apparatus, the inspection circuit inspects the gate lines that are divided into two groups during the first and second inspections, respectively.

Thus, positions and causes for the defects of the pixel part may be accurately detected, thereby improving inspecting efficiency.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A method of inspecting an array substrate that includes a pixel part disposed in a pixel area and a driving circuit disposed in a first peripheral area adjacent to a first side of the pixel area, the method comprising:

applying a first inspection voltage to odd-numbered gate lines through a first inspection line of an inspection circuit during a first inspection time, the inspection circuit being disposed in a second peripheral area adjacent to a second side of the pixel area, which is opposite to the first side with respect to the pixel area;

applying a second inspection voltage to even-numbered gate lines through a second inspection line of the inspection circuit during the first inspection time;

applying the second inspection voltage to the odd-numbered gate lines through the first inspection line during a second inspection time; and applying the first inspection voltage to the even-numbered gate lines through the second inspection line during the second inspection time, wherein the inspection circuit further includes a third inspection line receiving the first inspection voltage during both the first inspection time and the second inspection time, the first inspection line is connected exclusively to the odd-numbered gate lines among the gate lines, the second inspection line is connected exclusively to the even-numbered gate lines among the gate lines, and an even-numbered gate line among the even-numbered gate lines is disposed between each pair of consecutively numbered odd-numbered gate lines among the odd-numbered gate lines.

2. The method of claim 1, wherein the inspection circuit includes a first switching device disposed between the first inspection line and a gate line in a corresponding stage, wherein the first switching device is connected to the first inspection line and the gate line in the corresponding stage, respectively.

3. The method of claim 2, wherein the inspection circuit further includes a second switching device connected to the first switching device.

4. The method of claim 3, wherein the first switching device comprises a first electrode connected to the gate line in the corresponding stage, a second electrode connected to the first inspection line, and a third electrode connected to the first inspection line.

5. The method of claim 4, wherein the second switching device comprises a first electrode connected to the first electrode of the first switching device, a second electrode connected to a gate line in a next stage of the corresponding stage, and a third electrode connected to the third electrode of the first switching device.

6. The method of claim 1, further comprising applying a third inspection voltage to the gate lines through a dummy inspection circuit disposed in the first peripheral area.

7. The method of claim 6, wherein the driving circuit includes:

a start signal line connected to an input terminal of a circuit portion;

a first clock line connected to a first clock terminal of the circuit portion;

a second clock line connected to a second clock terminal of the circuit portion; and a voltage line connected to a voltage terminal of the circuit portion, wherein the dummy inspection circuit includes a connection line connecting the start signal line, the first clock line, the second clock line and the voltage line to each other, so that the third inspection voltage is applied to the start signal line, the first clock line, the second clock line and the voltage line, respectively.

8. The method of claim 1 wherein the first inspection voltage is applied to the odd-numbered gate lines in response to the first inspection voltage applied through the third inspection line during the first inspection time, and the second inspection voltage is applied to the even-numbered gate lines in response to the first inspection voltage applied through the third inspection line during the first inspection time, wherein the second inspection voltage is applied to the odd-numbered gate lines in response to the first inspection voltage applied through the third inspection line during the second inspection time, and the first inspection voltage is applied to the even-numbered gate lines in response to the first inspection voltage applied through the third inspection line during the second inspection time.

9. The method of claim 8, wherein the inspection circuit includes a first switching device disposed between the first inspection line and a gate line in a corresponding stage, wherein the first switching device is connected to the first inspection line, the third inspection line and the gate line in the corresponding stage, respectively.

10. The method of claim 9, wherein the inspection circuit further includes a second switching device connected to the first switching device.

11. The method of claim 10, wherein the first switching device comprises a first electrode connected to the gate line in the corresponding stage, a second electrode connected to the third inspection line, and a third electrode connected to the first inspection line.

12. The method of claim 11, wherein the second switching device comprises a first electrode connected to the first electrode of the first switching device, a second electrode connected to a gate line in a next stage of the corresponding stage, and a third electrode connected to the third electrode of the first switching device.

13. The method of claim 8, further comprising:

applying a ground voltage to the odd-numbered gate lines by the first inspection line in response to the first inspection voltage applied through the third inspection line during a grounding time; and applying a ground voltage to the even-numbered gate lines by the second inspection line in response to the first inspection voltage applied through the third inspection line during the grounding time.

* * * * *